US012432465B2

(12) United States Patent
Yufune

(10) Patent No.: US 12,432,465 B2
(45) Date of Patent: Sep. 30, 2025

(54) IMAGING DEVICE, SENSOR, AND IMAGING CONTROL DEVICE

(71) Applicant: Sony Semiconductor Solutions Corporation, Kanagawa (JP)

(72) Inventor: Shuta Yufune, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 54 days.

(21) Appl. No.: 18/575,379

(22) PCT Filed: Jul. 6, 2022

(86) PCT No.: PCT/JP2022/026817
§ 371 (c)(1),
(2) Date: Dec. 29, 2023

(87) PCT Pub. No.: WO2023/021871
PCT Pub. Date: Feb. 23, 2023

(65) Prior Publication Data
US 2024/0314456 A1 Sep. 19, 2024

(30) Foreign Application Priority Data

Aug. 18, 2021 (JP) ................................ 2021-133379

(51) Int. Cl.
*H04N 25/42* (2023.01)
*H04N 23/61* (2023.01)
(Continued)

(52) U.S. Cl.
CPC ............. *H04N 25/42* (2023.01); *H04N 23/61* (2023.01); *H04N 23/843* (2023.01);
(Continued)

(58) Field of Classification Search
CPC ...... H04N 23/12; H04N 23/61; H04N 23/611; H04N 23/667; H04N 23/672;
(Continued)

(56) References Cited

U.S. PATENT DOCUMENTS 6,839,452 B1   1/2005 Yang
2020/0314364 A1* 10/2020 Kim ..................... H04N 25/447
(Continued)

FOREIGN PATENT DOCUMENTS

JP   2010147816 A   7/2010
JP   2014007454 A   1/2014
(Continued)

OTHER PUBLICATIONS

International Search Report (PCT/ISA/210), International Application No. PCT/JP2022/026817, dated Sep. 20, 2022.

*Primary Examiner* — Daniel M Pasiewicz
(74) *Attorney, Agent, or Firm* — Michael Best & Friedrich LLP

(57) ABSTRACT

Imaging devices with subject image resolution adjustment are disclosed. In one example, an imaging device includes an imaging element, a resolution selection unit, and an image signal addition unit. Pixel blocks are two-dimensionally arranged and include pixels and an on-chip lens. The pixels perform photoelectric conversion on incident light from a subject and generate an image signal. The on-chip lens collects the incident light on the pixels. The resolution selection unit selects a first, second, and third resolutions. The first resolution is in accordance with the size of the pixels. The second resolution is in accordance with the size of the pixel blocks. The third resolution is in accordance with the size of a pixel block unit including adjacent pixel blocks. The image signal addition unit generates a second (Continued)

image signal by adding the generated image signals in accordance with the selected resolution.

18 Claims, 25 Drawing Sheets

(51) Int. Cl.
| | |
|---|---|
| *H04N 23/67* | (2023.01) |
| *H04N 23/84* | (2023.01) |
| *H04N 25/13* | (2023.01) |
| *H04N 25/447* | (2023.01) |
| *H04N 25/46* | (2023.01) |
| *H04N 25/704* | (2023.01) |

(52) U.S. Cl.
CPC ......... *H04N 25/134* (2023.01); *H04N 25/447* (2023.01); *H04N 25/46* (2023.01); *H04N 25/704* (2023.01); *H04N 23/672* (2023.01)

(58) Field of Classification Search
CPC .. H04N 23/815; H04N 23/843; H04N 25/134; H04N 25/40; H04N 25/42; H04N 25/447; H04N 25/46; H04N 25/704
See application file for complete search history.

(56) References Cited

U.S. PATENT DOCUMENTS

| | | | |
|---|---|---|---|
| 2020/0358989 A1* | 11/2020 | Hoshino | H10F 39/806 |
| 2021/0067749 A1* | 3/2021 | Yadav | H04N 25/135 |
| 2021/0211615 A1* | 7/2021 | Kim | H04N 25/60 |
| 2022/0328548 A1* | 10/2022 | Lee | H04N 25/78 |
| 2022/0345606 A1* | 10/2022 | Sato | H04N 23/72 |

FOREIGN PATENT DOCUMENTS

| | | |
|---|---|---|
| JP | 2014228671 A | 12/2014 |
| WO | 2014007454 A1 | 1/2014 |
| WO | 2017126326 A1 | 7/2017 |
| WO | 2018003502 A1 | 1/2018 |
| WO | 2019102887 A1 | 5/2019 |

\* cited by examiner

IMAGING DEVICE, SENSOR, AND IMAGING CONTROL DEVICE

FIELD

The present disclosure relates to an imaging device, a sensor, and an imaging control device.

BACKGROUND

A device that generates an image of a subject is used (e.g., see Patent Literature 1). The device includes an imaging element in which photoelectric conversion elements are arranged in a two-dimensional matrix. The photoelectric conversion elements perform photoelectric conversion on incident light.

CITATION LIST

Patent Literature

Patent Literature 1: JP 2014-228671 A

SUMMARY

Technical Problem

Unfortunately, in the above-described conventional technique, a resolution of an image of a subject cannot be adjusted, and convenience is reduced.

Therefore, the present disclosure proposes an imaging device that adjusts the resolution of an image of a subject.

Solution to Problem

An imaging device according to the present disclosure includes: an imaging element in which pixel blocks are arranged in a two-dimensional matrix, the pixel blocks including a plurality of pixels that performs photoelectric conversion on incident light from a subject and generates an image signal and an on-chip lens that is arranged in common in the plurality of pixels and that collects the incident light on the plurality of pixels; a resolution selection unit that selects a first resolution in accordance with a size of the pixels, a second resolution in accordance with a size of the pixel blocks, and a third resolution in accordance with a size of a pixel block unit including a plurality of adjacent pixel blocks; and an image signal addition unit that generates a second image signal by adding generated image signals in accordance with a selected resolution.

DESCRIPTION OF EMBODIMENTS

Embodiments of the present disclosure will be described in detail below with reference to the drawings. The description will be given in the following order. Note that, in each of the following embodiments, the same reference signs are attached to the same parts to omit duplicate description.
1. First Embodiment
2. Second Embodiment
3. Third Embodiment
4. Fourth Embodiment
5. Fifth Embodiment
6. Sixth Embodiment
7. Seventh Embodiment
8. Variations
9. Configuration Example of Pixel Block

1. First Embodiment

[Configuration of Imaging Device]

Figure 1:
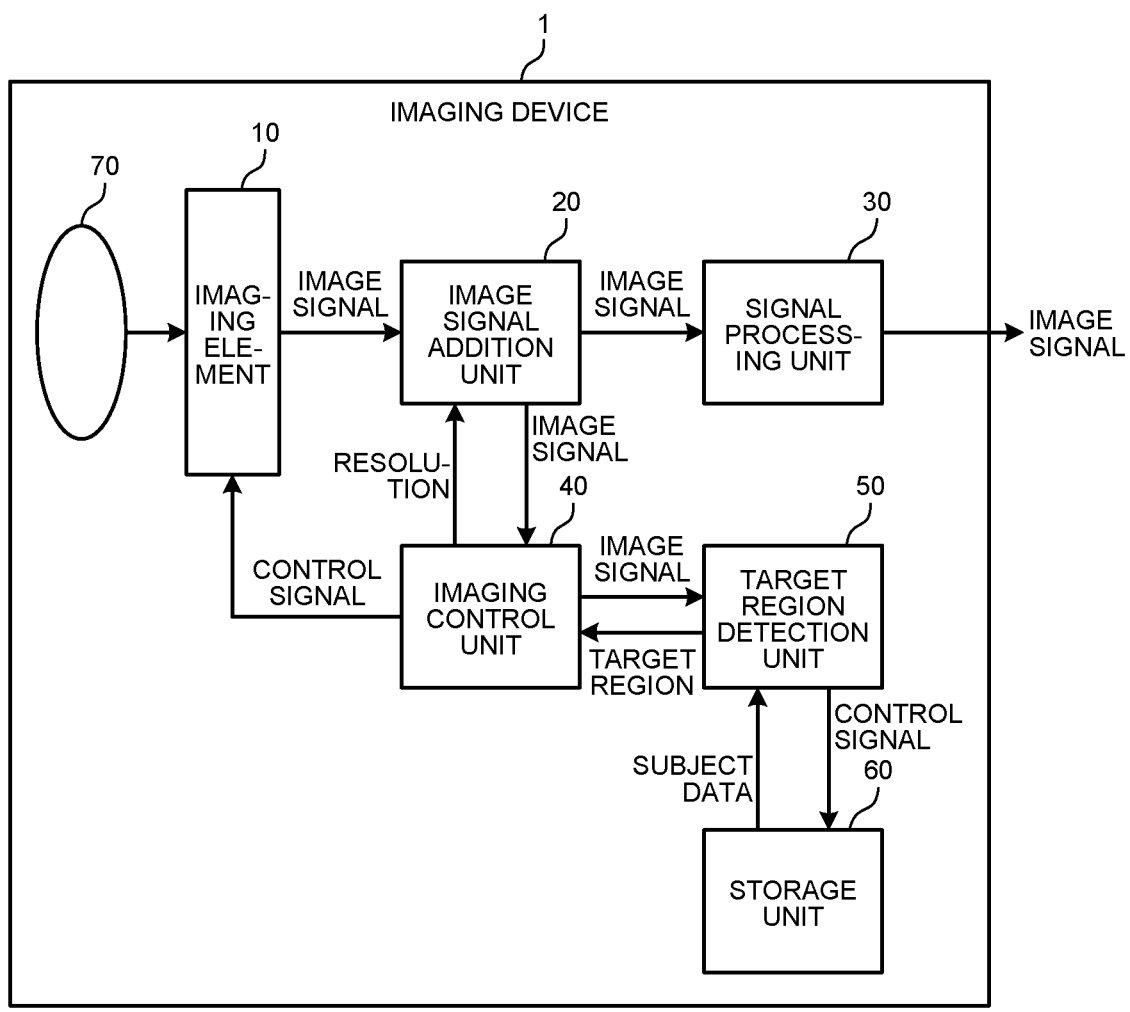
FIG. 1 illustrates a configuration example of an imaging device according to a first embodiment of the present disclosure.

FIG. 1 illustrates a configuration example of an imaging device according to a first embodiment of the present disclosure. The figure is a block diagram illustrating a configuration example of an imaging device 1. The imaging device 1 generates an image signal constituting an image of a subject. The imaging device 1 includes an imaging element 10, an image signal addition unit 20, a signal processing unit 30, an imaging control unit 40, a target region detection unit 50, a storage unit 60, and an imaging lens 70.

The imaging element 10 images a subject, and generates an image signal. The imaging element 10 includes a pixel array unit (pixel array unit 11 to be described later) in which pixels (pixels 100 to be described later) are arranged in a two-dimensional matrix. The pixels perform photoelectric conversion on incident light from the subject. The imaging element 10 in the figure generates an image signal based on a control signal from the imaging control unit 40. The generated image signal is output to the image signal addition unit 20. Note that details of the configuration of the imaging element 10 will be described later.

The imaging control unit 40 controls imaging in the imaging element 10. The imaging control unit 40 controls the imaging element 10 by outputting a control signal. For example, the imaging control unit 40 performs control to cause the imaging element 10 to capture a still image and a moving image.

Furthermore, the imaging control unit 40 performs processing of selecting a resolution of an image. As described later, the imaging control unit 40 can select a first resolution, a second resolution, and a third resolution. The first resolution is equal to the density of a plurality of pixels 100 arranged in the imaging element 10. The second resolution is ¼ of the first resolution. The third resolution is ¼ of the second resolution. These selected resolutions are output to the image signal addition unit 20. Furthermore, the imaging control unit 40 can select a resolution in accordance with a target region, which is a region of an image including a target to be imaged among subjects. A target region input from the target region detection unit 50 to be described later can be used as the target region. In contrast, the imaging control unit 40 outputs an image signal to the target region detection unit 50.

Note that imaging modes in which the first resolution, the second resolution, and the third resolution are selected are referred to as a first imaging mode, a second imaging mode, and a third imaging mode, respectively. Details of the selection of the resolutions performed by the imaging control unit 40 will be described later. Note that the imaging control unit 40 is one example of a resolution selection unit described in the claims.

The image signal addition unit 20 adds image signals in accordance with a resolution selected by the imaging control unit 40, and generates a new image signal (second image signal). The image signal addition unit 20 adds image signals generated by four adjacent pixels 100, and generates an image signal in accordance with the second resolution. Furthermore, the image signal addition unit 20 adds image signals generated by 16 adjacent pixels 100, and generates an image signal in accordance with the third resolution. Note that, in order to prevent overflow, the image signal addition unit 20 can adjust the number of digits at the time of addition. The image signal addition unit 20 outputs the generated image signals to the signal processing unit 30. Details of the addition of the image signals in the image signal addition unit 20 will be described later.

The signal processing unit 30 processes the image signals output from the image signal addition unit 20. Details of the configuration of the signal processing unit 30 will be described later.

The target region detection unit 50 detects a target region from an image based on an image signal input from the imaging control unit 40. As described above, the target region includes a target to be imaged. The target corresponds to, for example, a specific person. The target region detection unit 50 searches an input image, and determines whether or not the input image includes the target. Then, when the image includes the target, the target region detection unit 50 detects a region including the target as a target region, and outputs the target region to the imaging control unit 40. The target region detection unit 50 in the figure specifies the target based on subject data output from the storage unit 60.

The storage unit 60 holds data on the target. For example, a target input by a user of the imaging device 1 can be applied to the target. The storage unit 60 stores information on the target such as data for identifying the target and a minimum size for tracking the target. Furthermore, the storage unit 60 outputs subject data, which is information on the target, to the target region detection unit 50 based on a control signal from the target region detection unit 50.

Note that the detection of the target region in the target region detection unit 50 is not limited to this example. For example, it is also possible to adopt a method in which a person or the like is recognized by artificial intelligence (AI) by using a preliminarily generated image and the AI detects a target region including the recognized person or the like.

The imaging lens 70 forms an image of a subject on a surface on which the pixels 100 of the imaging element 10 are arranged. Note that the imaging control unit 40, the target region detection unit 50, and the storage unit 60 constitute an imaging control device. Furthermore, the imaging element 10 and the image signal addition unit 20 constitute a sensor.

[Configuration of Imaging Element]

Figure 2:
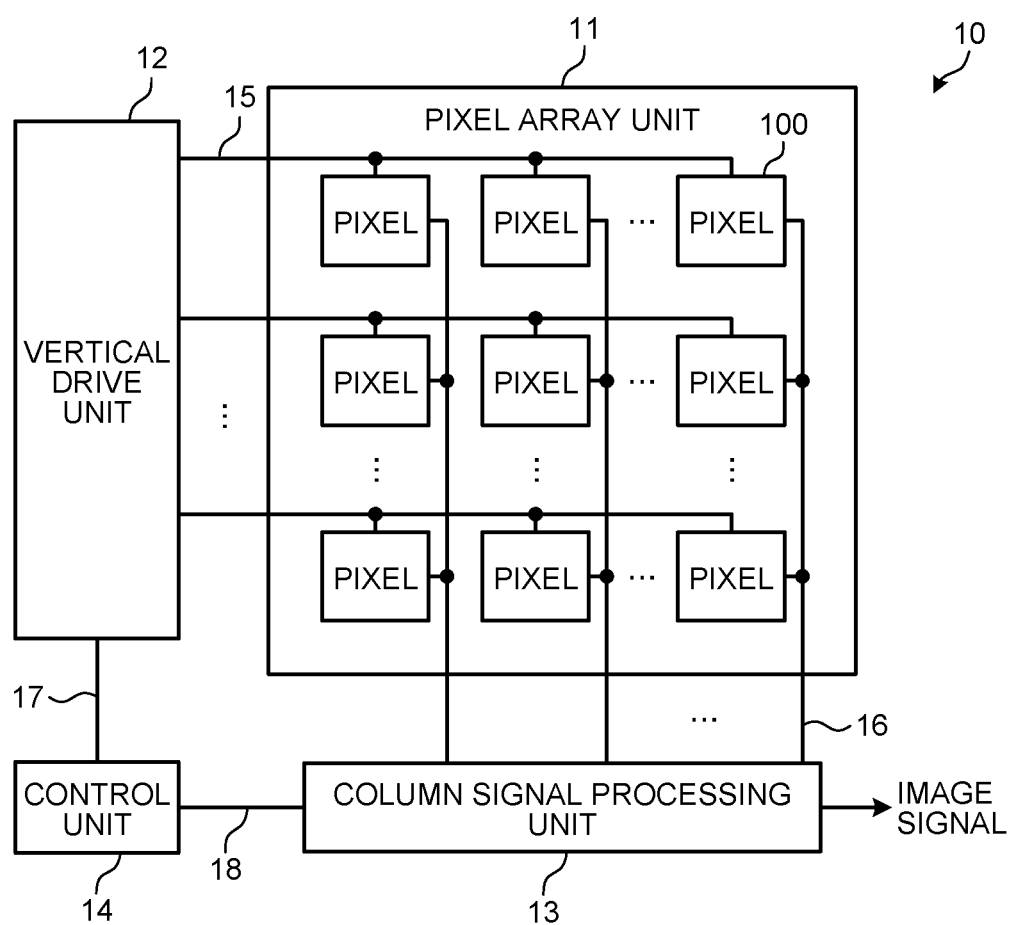
FIG. 2 illustrates a configuration example of an imaging element according to the embodiment of the present disclosure.

FIG. 2 illustrates a configuration example of an imaging element according to the embodiment of the present disclosure. The figure is a block diagram illustrating a configuration example of an imaging element 10. The imaging element 10 is a semiconductor element that generates image data on a subject. The imaging element 10 includes the pixel array unit 11, a vertical drive unit 12, a column signal processing unit 13, and a control unit 14.

The pixel array unit 11 is configured by arranging a plurality of pixels 100. The pixel array unit 11 in the figure represents an example in which a plurality of pixels 100 is arranged in a shape of a two-dimensional matrix. Here, the pixel 100 includes a photoelectric conversion unit that performs photoelectric conversion of incident light, and generates an image signal of the subject based on applied incident light. For example, a photodiode can be used as the photoelectric conversion unit. Signal lines 15 and 16 are arranged in each of the pixels 100. A pixel 100 is controlled by a control signal transmitted by the signal line 15 to generate an image signal, and outputs the generated image signal via the signal line 16. Note that the signal line 15 is arranged for each row of the shape of the two-dimensional matrix, and is arranged in common in a plurality of pixels 100 arranged in one row. The signal line 16 is arranged for each column of the shape of the two-dimensional matrix, and is arranged in common in a plurality of pixels 100 arranged in one column.

The vertical drive unit 12 generates a control signal of the above-described pixel 100. The vertical drive unit 12 in the figure generates a control signal for each row of the two-dimensional matrix of the pixel array unit 11, and sequentially outputs the control signal via the signal line 15.

The column signal processing unit 13 processes an image signal generated by the pixel 100. The column signal processing unit 13 in the figure simultaneously processes image signals from the plurality of pixels 100 arranged in one row of the pixel array unit 11 transmitted via the signal line 16. In the processing, for example, analog-digital conversion and correlated double sampling (CDS) can be performed. In the analog-digital conversion, an analog image signal generated by the pixel 100 is converted into a digital image signal. In the CDS, an offset error of an image signal is removed. The processed image signal is output to a circuit or the like outside the imaging element 10.

The control unit 14 controls the vertical drive unit 12 and the column signal processing unit 13. The control unit 14 in the figure generates a control signal for controlling the vertical drive unit 12 and the column signal processing unit 13 based on data for giving an instruction for a clock, an operation mode, and the like input from an external circuit or the like. Next, the control unit 14 outputs control signals via a signal lines 17 and 18 to control the vertical drive unit 12 and the column signal processing unit 13.

[Configuration in Plane of Imaging Element]

Figure 3:
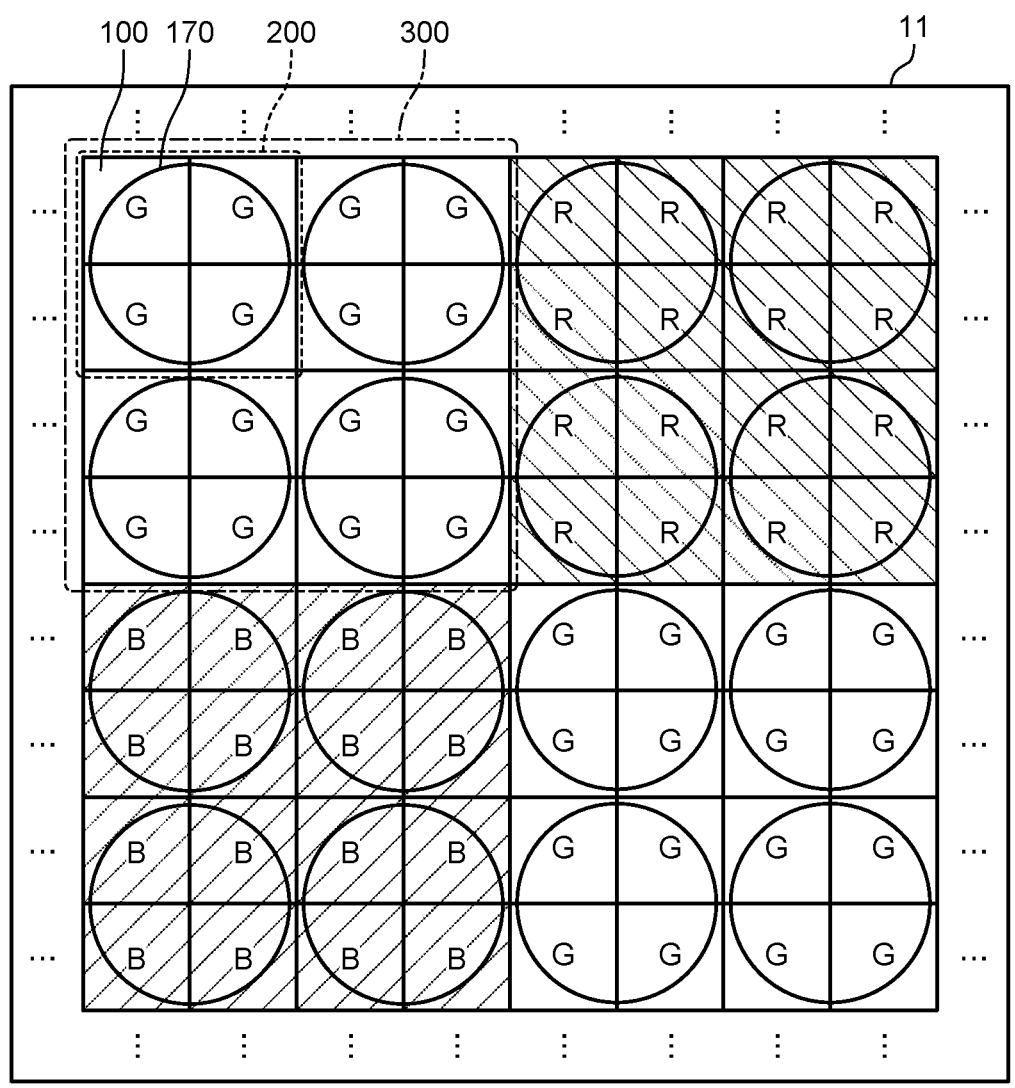
FIG. 3 illustrates a configuration example of a pixel according to the first embodiment of the present disclosure.

FIG. 3 illustrates a configuration example of a pixel according to the first embodiment of the present disclosure. The figure is a plan view illustrating a configuration example of the pixel 100. As described above, the pixels 100 are arranged in the pixel array unit 11. The figure illustrates an example in which the pixels 100 are arranged in a two-dimensional matrix. Note that "R", "G", and "B" attached to the pixels 100 in the figure represent types of color filters 150 to be described later. The figure represents arrangement of the color filters 150 in which "R", "G", and "B" correspond to red light, green light, and blue light, respectively. Furthermore, an open rectangle in the figure represents a pixel 100 in which the color filter 150 for green light is arranged. Furthermore, a rectangle diagonally hatched downward to the right in the figure represents a pixel 100 in which the color filter 150 for red light is arranged. Furthermore, a rectangle diagonally hatched upward to the right in the figure represents a pixel 100 in which the color filter 150 for blue light is arranged.

Furthermore, an on-chip lens 170 is arranged in the pixel 100. The on-chip lens 170 collects incident light on a photoelectric conversion unit (photoelectric conversion unit 101) of the pixel 100, and is arranged in common in a plurality of pixels 100. The figure illustrates an example in which the on-chip lens 170 is arranged in common in four pixels 100 arranged in two rows and two columns. Furthermore, the on-chip lens 170 in the figure is arranged in common in four pixels 100 in which the color filters 150 of the same color are arranged. The on-chip lens 170 and the plurality of pixels 100 sharing the on-chip lens 170 constitute a pixel block 200.

Furthermore, a plurality of adjacent pixel blocks 200 constitutes a pixel block unit 300. The figure illustrates an example in which four pixel blocks 200 arranged in two rows and two columns constitute the pixel block unit 300. Furthermore, color filters 150 of the same color are arranged in the pixel block 200 included in the pixel block unit 300. This figure illustrates an example in which the pixel block units 300 for red light, green light, and blue light are arranged in a Bayer array. As described above, a plurality of pixel block units 300 is arranged in a two-dimensional matrix in the imaging element 10.

The figure illustrates an example in which the on-chip lens 170 has a circular shape in plan view. Note that the on-chip lens 170 can also have a rectangular shape in plan view.

The above-described first resolution corresponds to a resolution in accordance with the density of the plurality of pixels 100 in the figure. The first resolution is the maximum resolution in the imaging element 10. The first resolution can be applied to, for example, imaging of a still image. So-called raw data can be generated by an image signal to which the first resolution is applied. When the above-described imaging control unit 40 selects the first resolution, the image signal addition unit 20 outputs an image signal output from the imaging element 10 to the signal processing unit 30 or the like without performing addition.

The above-described second resolution corresponds to a resolution in accordance with the density of the pixel blocks 200 in the figure. As illustrated in the figure, the second resolution is ¼ of the first resolution. The second resolution can be applied to, for example, imaging of a moving image of approximately 8K. When the above-described imaging control unit 40 selects the second resolution, the image signal addition unit 20 adds four image signals included in the pixel block 200, and outputs an image signal after the addition to the signal processing unit 30 or the like.

The above-described third resolution corresponds to a resolution in accordance with the density of the pixel block unit 300 in the figure. As illustrated in the figure, the third resolution is ¼ of the second resolution, and is ¹⁄₁₆ of the first resolution. The third resolution can be applied to, for example, imaging of a moving image of approximately 4K. When the above-described imaging control unit 40 selects the third resolution, the image signal addition unit 20 adds 16 image signals included in the pixel block unit 300, and outputs an image signal after the addition to the signal processing unit 30 or the like. Note that, in the sensor including the imaging element 10 and the image signal addition unit 20, an operation mode for generating an image signal for each pixel 100 is referred to as a first mode. Furthermore, an operation mode for generating an image signal for each pixel block 200 is referred to as a second mode. Furthermore, an operation mode for generating an image signal for each pixel block unit 300 is referred to as a third mode.

Since the same type of color filters 150 are arranged in the pixels 100 included in the pixel block 200 and the pixel block unit 300, a resolution can be changed by adding an image signal. Processing of change a resolution can be simplified.

[Configuration of Cross Section of Imaging Element]

Figure 4:
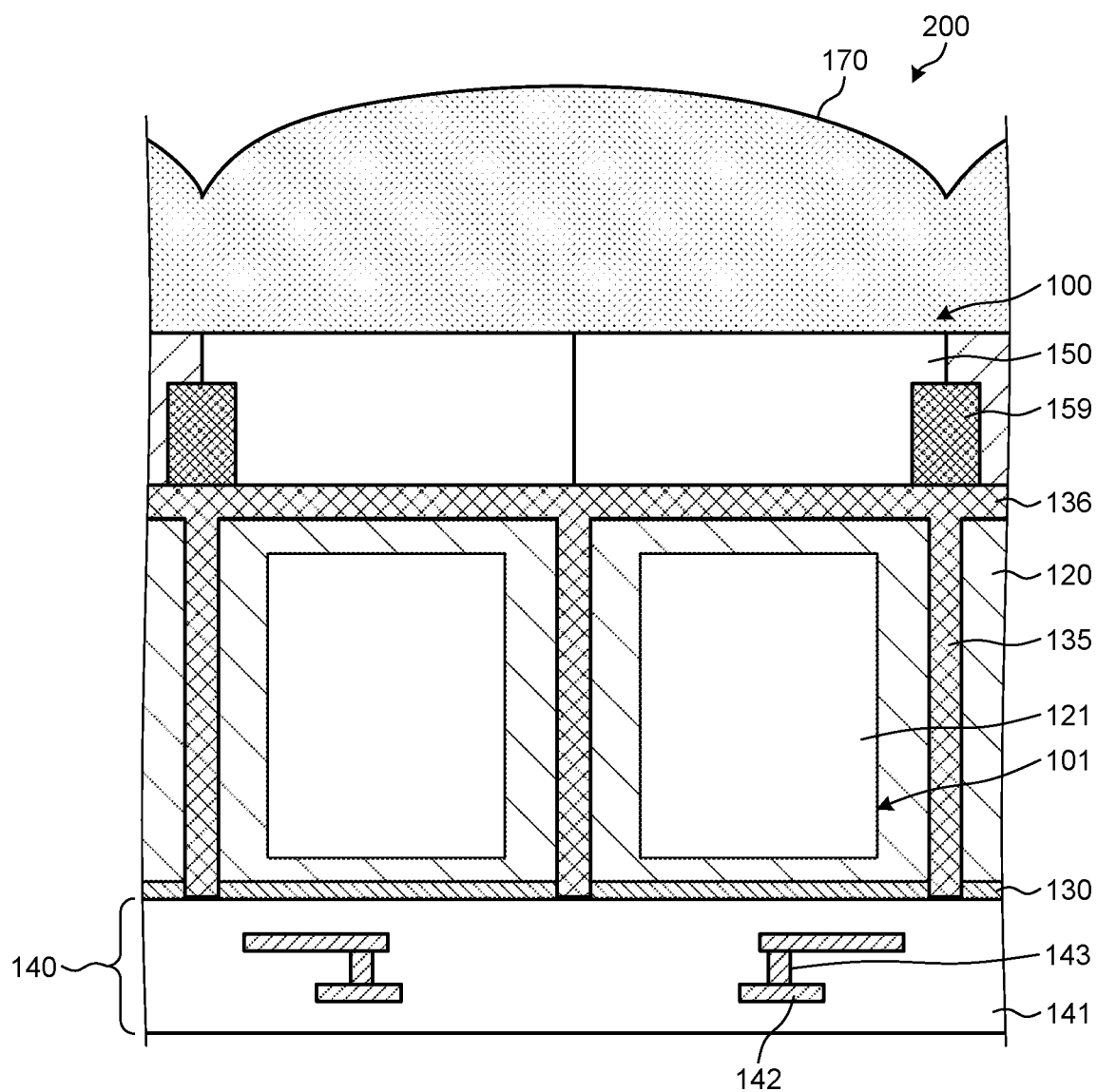
FIG. 4 is a cross-sectional view illustrating a configuration example of a pixel according to the embodiment of the present disclosure.

FIG. 4 is a cross-sectional view illustrating a configuration example of a pixel according to the embodiment of the present disclosure. The figure is a cross-sectional view illustrating a configuration example of the pixel 100. Furthermore, the pixel 100 in the figure is included in the pixel block 200 in which the on-chip lens 170 is arranged in common. The pixel 100 includes a semiconductor substrate 120, an insulating film 130, a wiring region 140, an isolation portion 135, a protective film 136, and the color filter 150.

A diffusion layer of a semiconductor element of the pixel 100 is arranged on the semiconductor substrate 120. The semiconductor substrate 120 can be made of, for example, silicon (Si). The semiconductor element and the like are arranged in a well region formed in the semiconductor substrate 120. For convenience, the semiconductor substrate 120 in the figure is assumed to be configured in a p-type well region. The semiconductor element can be formed by arranging an n-type or p-type semiconductor region in the p-type well region. The photoelectric conversion unit 101 is illustrated as an example on the semiconductor substrate 120 in the figure. The photoelectric conversion unit 101 includes an n-type semiconductor region 121. Specifically, a photodiode formed by a pn junction at an interface between the n-type semiconductor region 121 and the surrounding p-type well region corresponds to the photoelectric conversion unit 101.

The insulating film 130 insulates the front surface side of the semiconductor substrate 120. For example, a film of silicon oxide ($SiO_2$) can be used as the insulating film 130.

The wiring region 140 is arranged on the front surface side of the semiconductor substrate 120. Wiring of elements is formed in the wiring region 140. The wiring region 140 includes a wire 141, a via plug 142, and an insulating layer 143. The wire 141 is a conductor that transmits a signal to an element of the semiconductor substrate 120 or the like. The wire 141 can be made of, for example, a metal such as copper (Cu) and tungsten (W). The via plug 142 connects wires 141 arranged in different layers together. The via plug 142 can be made of, for example, a columnar metal. The insulating layer 143 insulates the wire 141 and the like. The insulating layer 143 can be made of, for example, $SiO_2$.

The isolation portion 135 is arranged at a boundary of the pixel 100 in the semiconductor substrate 120 to electrically and optically isolate the pixel 100. The isolation portion 135 can be made of an insulator embedded in the semiconductor substrate 120. The isolation portion 135 can be formed by, for example, arranging an insulator such as $SiO_2$ in a groove penetrating the semiconductor substrate 120 formed at the boundary of the pixel 100.

The protective film 136 protects the back surface side of the semiconductor substrate 120. The protective film 136 can be made of an insulator such as $SiO_2$. The protective film 136 in the figure can be formed simultaneously with the isolation portion 135.

The color filter 150 is an optical filter that transmits a beam of incident light having a predetermined wavelength among beams of incident light. For example, a color filter that transmits red light, green light, and blue light can be used as the color filter 150. In this case, one color filter 150 for any of red light, green light, and blue light is arranged in the pixel 100. The pixel 100 generates an image signal of incident light having a wavelength supported by the color filter 150. As described above, the same type of color filters 150 are arranged in the plurality of pixels 100 arranged in the pixel block 200. Furthermore, the color filter 150 in the figure is arranged on the back surface side of the semiconductor substrate 120.

Note that, in the pixel 100 in the figure, a light shielding film 159 is arranged in the region of the color filter 150 at the boundary of the pixel block 200. The light shielding film 159 blocks incident light. Incident light obliquely incident from an adjacent pixel 100 can be blocked by arranging the light shielding film 159. Since the light shielding film 159 blocks incident light transmitted through a different type of color filter 150 of the pixels 100 of the adjacent pixel block 200, color mixing can be prevented, and a decrease in image quality can be prevented.

The on-chip lens 170 is arranged in common in the plurality of pixels 100 constituting the pixel block 200 as described above. The on-chip lens 170 in the figure has a hemispherical cross section, and collects incident light on the photoelectric conversion unit 101. The on-chip lens 170 can be made of an organic material such as acrylic resin or an inorganic material such as silicon nitride (SiN).

[Configuration of Signal Processing Unit]

Figure 5:
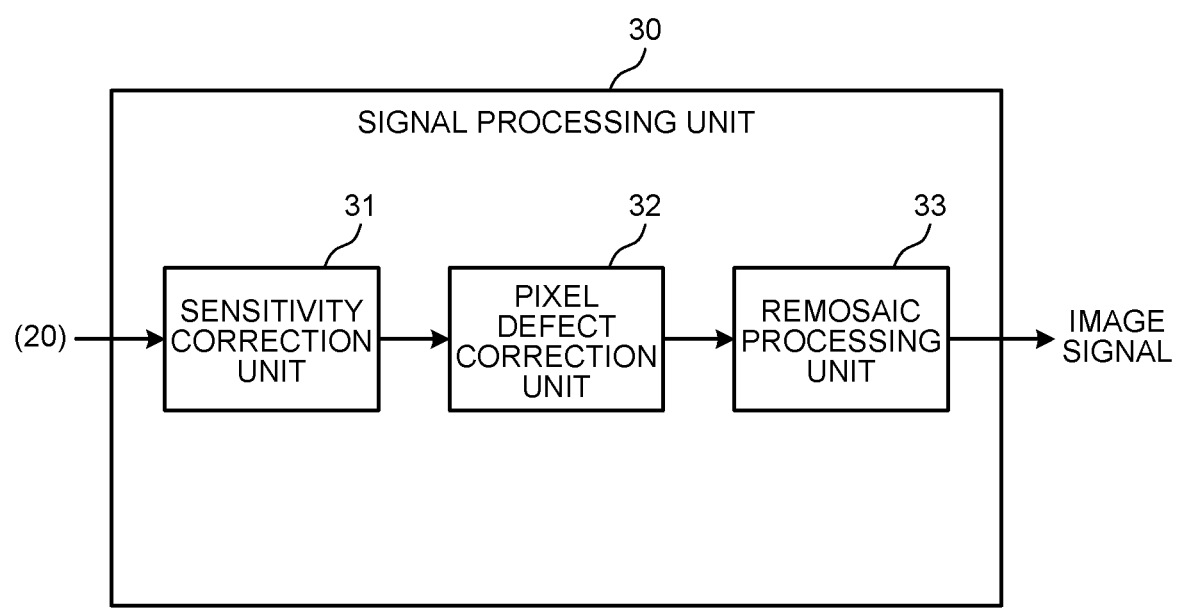
FIG. 5 illustrates a configuration example of a signal processing unit according to the first embodiment of the present disclosure.

FIG. 5 illustrates a configuration example of a signal processing unit according to the first embodiment of the present disclosure. The figure is a block diagram illustrating a configuration example of the signal processing unit 30. The signal processing unit 30 in the figure includes a sensitivity correction unit 31, a pixel defect correction unit 32, and a remosaic processing unit 33.

The sensitivity correction unit 31 corrects a sensitivity difference of the pixel 100. For example, the sensitivity difference of the pixel 100 is generated in accordance with an incident angle of incident light. The sensitivity correction unit 31 corrects such a sensitivity difference. A corrected image signal is output to the pixel defect correction unit 32.

The pixel defect correction unit 32 corrects an image signal from a defective pixel 100. The corrected image signal is output to the remosaic processing unit 33.

The remosaic processing unit 33 performs remosaic processing on an image signal. In the remosaic processing, conversion into an image signal in accordance with an array in an arrangement order of a plurality of color filters different from an array of the pixels 100 of the pixel array unit 11 is performed. The image signal after the remosaic processing is output to an external device. The remosaic processing will be described with reference to FIGS. 6A to 6C.

[Remosaic Processing]

Figure 6A:
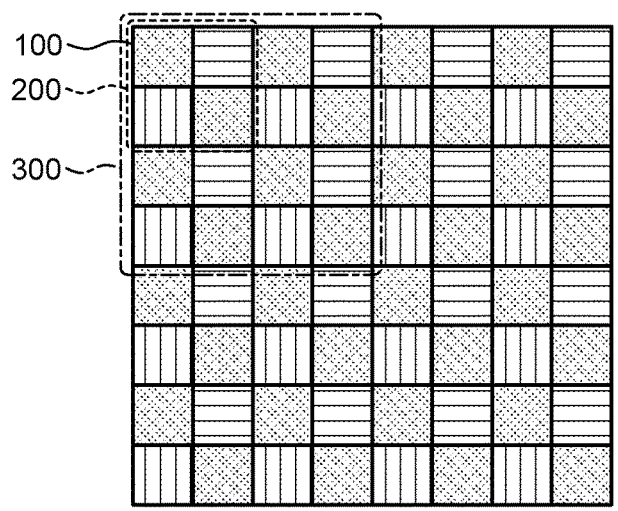
FIG. 6A illustrates one example of remosaic processing according to the embodiment of the present disclosure.
Figure 6B:
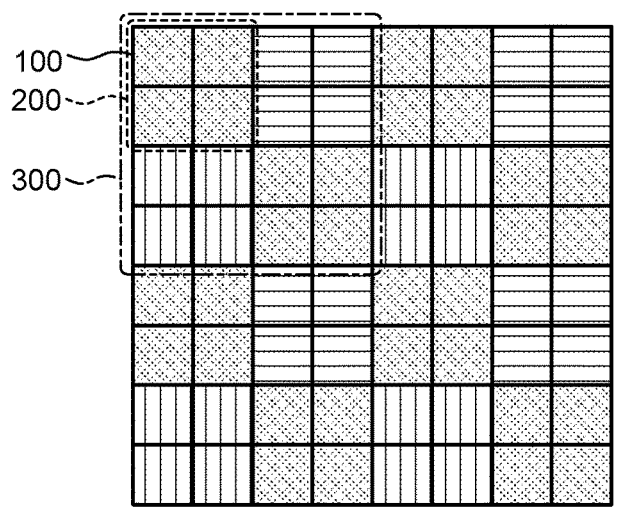
FIG. 6B illustrates one example of the remosaic processing according to the embodiment of the present disclosure.
Figure 6C:
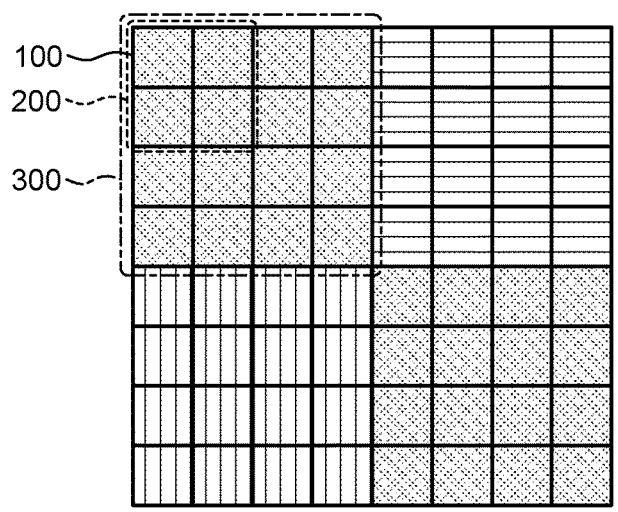
FIG. 6C illustrates one example of the remosaic processing according to the embodiment of the present disclosure.

FIGS. 6A to 6C illustrate examples of the remosaic processing according to the embodiment of the present disclosure. The figure illustrates a wavelength of incident light supported by an image signal for each pixel 100. In the figure, a dot-hatched rectangle represents a region of an image signal for green light. A rectangle hatched with horizontal lines represents a region of an image signal for red light. A rectangle hatched with vertical lines represents a region of an image signal for blue light.

FIG. 6A illustrates an example of the remosaic processing in the first resolution. The figure illustrates an example in which the remosaic processing is performed such that four pixels 100 are arranged in the Bayer array for each pixel block 200. The pixel block 200 in the top left of the figure will be described as an example. It is assumed that the color filter 150 for green light is arranged. In the color filter 150, the pixel 100 of the pixel block 200 supports green light similarly to the pixel block 200 in the top left of FIG. 3. In this case, an image signal for red light and an image signal for blue light are generated in the remosaic processing, and each replaced with image signals for green light in the top right and the bottom left of the pixel block 200.

FIG. 6B illustrates an example of the remosaic processing in the second resolution. The figure illustrates an example in which the remosaic processing is performed such that four pixel blocks 200 are arranged in the Bayer array for each pixel block unit 300. For the pixel 100 of an image signal in accordance with a wavelength different from the color filter 150 in the array in FIG. 3, an image signal in accordance with the wavelength is generated and replaced.

FIG. 6C illustrates an example of the remosaic processing in the third resolution. The figure illustrates an example in which the remosaic processing is performed such that the Bayer array for four pixel block units 300 is established. For the pixel 100 of an image signal in accordance with a wavelength different from the color filter 150 in the array in FIG. 3, an image signal in accordance with the wavelength is generated and replaced. Note that a known method can be applied to the generation of an image signal accompanying the remosaic processing.

An image signal in accordance with the Bayer array can be output in each of the first resolution, the second resolution, and the third resolution by performing such remosaic processing.

[Example of Image]

Figure 7A:
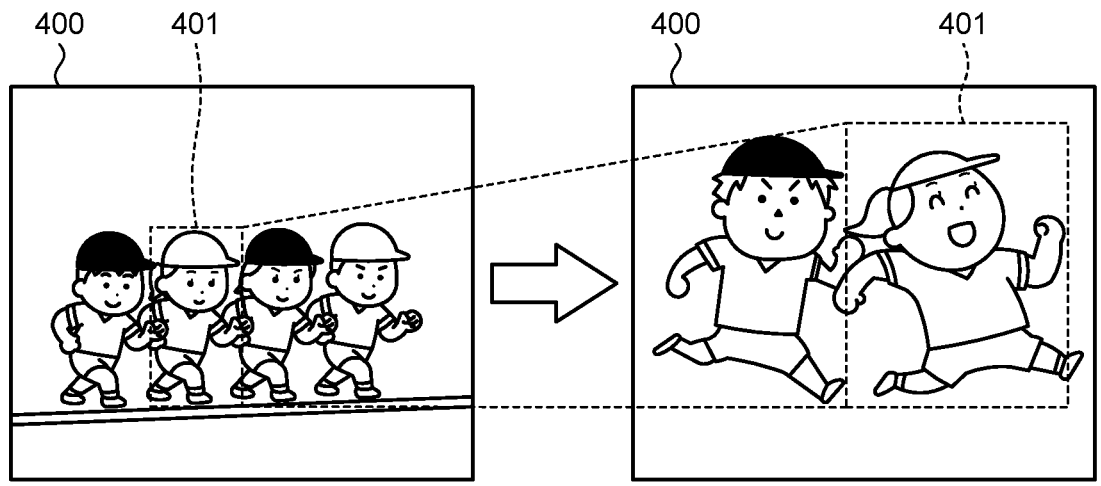
FIG. 7A illustrates one example of an image generated by the imaging device according to the embodiment of the present disclosure.
Figure 7B:
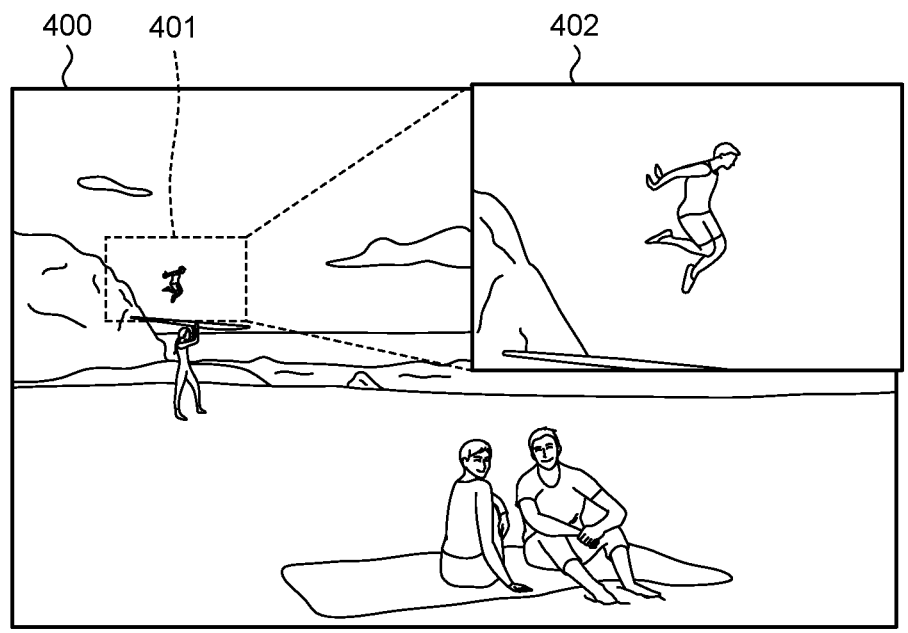
FIG. 7B illustrates one example of the image generated by the imaging device according to the embodiment of the present disclosure.

FIGS. 7A and 7B illustrate examples of images generated by the imaging device according to the embodiment of the present disclosure. The figure illustrates an example in which the resolution and configuration of an image are changed for each imaging scene in the imaging device 1.

FIG. 7A illustrates an example in which a moving image is captured while a target designated from a plurality of subjects is followed and the resolution is changed. An image 400 on the left side of the figure illustrates a subject at the start of imaging. In this image, the target region detection unit 50 searches for the target, and detects a target region. A dashed rectangle represents a detected target region 401. The target region detection unit 50 continuously detects the target region 401 in response to movements of the target, and outputs the detected target region 401 to the imaging control unit 40. Furthermore, the imaging control unit 40 can change the resolution in accordance with the size of the target region 401 as in the image 400 on the right side of the figure. For example, the imaging control unit 40 can use the first resolution as an initial value. When the target region 401 has a size equal to or smaller than a predetermined threshold (first size), the imaging control unit 40 can select the second resolution. Moreover, when the target region 401 has a size equal to or smaller than a predetermined threshold (second size), the imaging control unit 40 can select the third resolution.

FIG. 7B illustrates an example in which a moving image is captured and an image of a target region set to have a different resolution is superimposed on the generated image. The image 400 in the figure is generated so as to have the third resolution, for example. When the target region detection unit 50 detects the target region 401 in the image 400, the imaging control unit 40 performs control of generating an image having a shape in which an image 402 enlarged by applying the first resolution is superimposed on the target region 401. Specifically, the imaging control unit 40 generates an image based on an image signal of the first resolution output from the imaging element 10 and an image based on an image signal of the third resolution generated by the image signal addition unit 20. The target region detection unit 50 detects the target region 401 in the image of the first resolution among these images. An image including regions of different resolutions can be generated by combining these images.

Note that, as illustrated in the figure, the first resolution can be applied only to the target region 401. This enables the target to be imaged with high image quality, and enables reduction of a data amount of the entire image.

[Imaging Processing]

Figure 8:
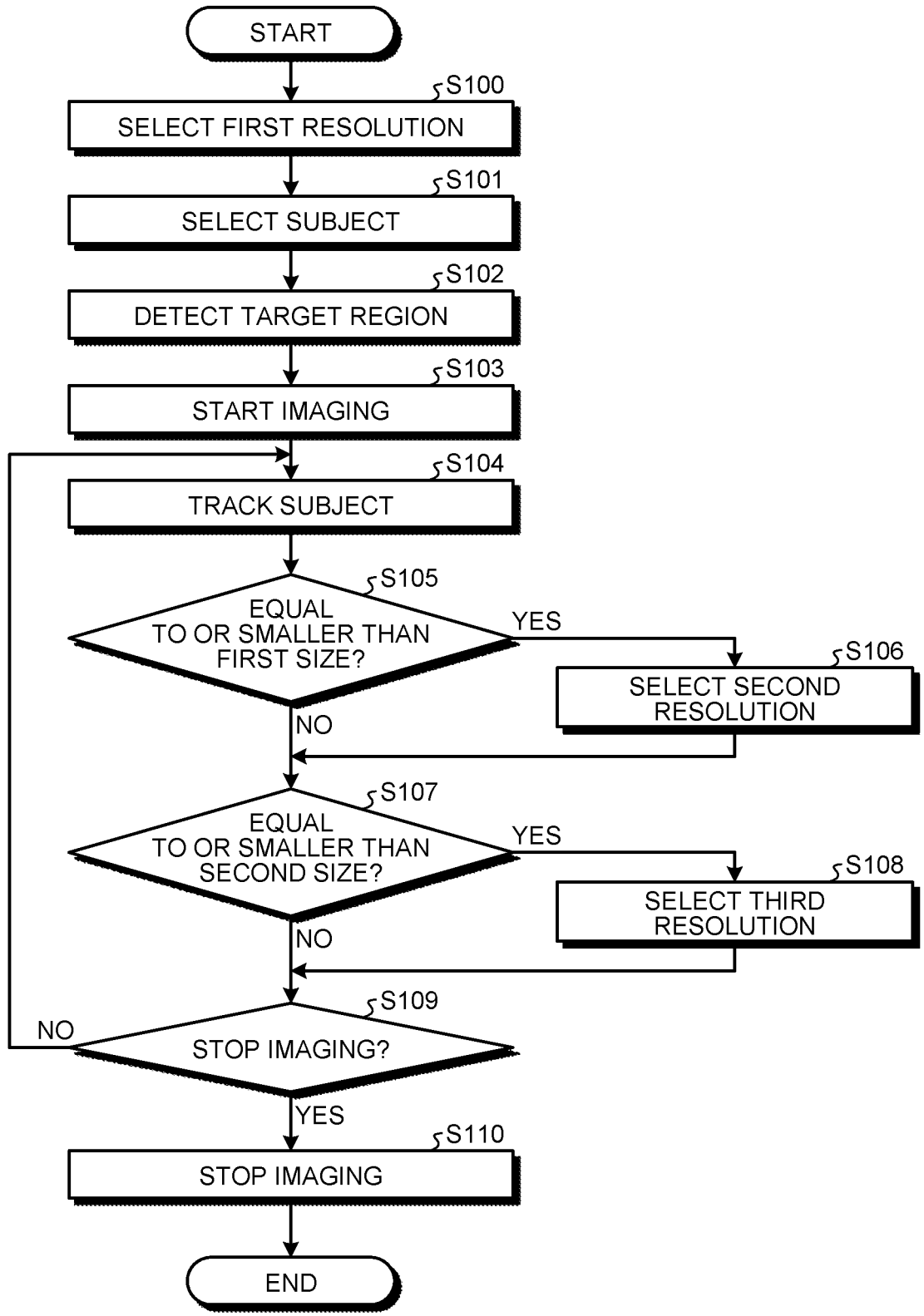
FIG. 8 illustrates one example of imaging processing according to the first embodiment of the present disclosure.

FIG. 8 illustrates one example of imaging processing according to the first embodiment of the present disclosure. The figure is a flowchart illustrating one example of imaging processing in the imaging device 1. First, the imaging control unit 40 selects the first resolution (Step S100). Next, the target region detection unit 50 selects a subject based on subject data in the storage unit 60 (Step S101). Next, the target region detection unit 50 detects a target region based on the selected subject (Step S102). Next, the imaging control unit 40 controls the imaging element 10 to start imaging (Step S103). Next, the target region detection unit 50 tracks the subject (Step S104). This can be performed by the target region detection unit 50 continuously detecting the target region in response to movements of the subject.

Next, the imaging control unit 40 determines whether or not the target region has a size equal to or smaller than the predetermined first size (Step S105). When the target region has a size equal to or smaller than the first size (Step S105, Yes), the imaging control unit 40 selects the second resolution (Step S106), and proceeds to processing of Step S107. In contrast, when the target region has a size larger than the first size (Step S105, No), the imaging control unit 40 proceeds to the processing of Step S107.

In Step S107, the imaging control unit 40 determines whether or not the target region has a size equal to or smaller than the predetermined second size (Step S107). When the target region has a size equal to or smaller than the second size (Step S107, Yes), the imaging control unit 40 selects the third resolution (Step S108), and proceeds to processing of Step S109. In contrast, when the target region has a size larger than the second size (Step S107, No), the imaging control unit 40 proceeds to the processing of Step S109.

In Step S109, the imaging control unit 40 determines whether or not to stop imaging (Step S109). This can be determined based on, for example, an operation to stop imaging performed by a user of the imaging device 1. When imaging is not stopped (Step S109, No), the processing proceeds to Step S104. When imaging is stopped (Step S109, Yes), the imaging control unit 40 controls the imaging element 10 to stop imaging (Step S110), and ends the imaging processing. The imaging device 1 can perform the imaging processing in the above-described procedure.

Note that a method of the imaging control unit 40 selecting a resolution is not limited to this example, and another practical example may be applied. For example, the imaging control unit 40 can also select a resolution in accordance with quality of a generated image. Specifically, the imaging control unit 40 can select a lower resolution when deterioration in image quality such as blown out highlights is detected. Furthermore, for example, the imaging control unit 40 can select a resolution in accordance with luminance. Specifically, when imaging is performed in a low-illuminance environment, the imaging control unit 40 can select a low resolution. This causes the image signal addition unit 20 to add image signals, and can increase signal levels of the image signals.

Furthermore, the imaging control unit 40 can also select a resolution in accordance with a generation rate (frame rate) at the time of capturing a moving image. For example, the imaging control unit 40 can select a low resolution when the frame rate is high. Specifically, the first resolution, the second resolution, and the third resolution can be applied to a first frame rate, a second frame rate, and a third frame rate of different values, respectively. This first frame rate can be a value of approximately ¼ of the second frame rate. Furthermore, the third frame rate can be a value of approximately ¼ of the second frame rate. Specifically, for example, frame rates of 7.5 fps, 30 fps, and 120 fps can be applied as the first frame rate, the second frame rate, and the third frame rate, respectively. This can reduce an increase in a data amount of a moving image.

As described above, the imaging device 1 according to the first embodiment of the present disclosure includes the imaging element 10 in which a plurality of pixel block units 300 is arranged, and can generate an image signal of a resolution selected by the imaging control unit 40. This enables imaging at a resolution in accordance with a subject, and can improve convenience.

2. Second Embodiment

The imaging device 1 of the first embodiment described above images a target region detected by the target region detection unit 50. In contrast, an imaging device 1 of a second embodiment of the present disclosure is different from that in the above-described first embodiment in that a target is recognized by using another sensor.

[Configuration of Imaging Device]

Figure 9:
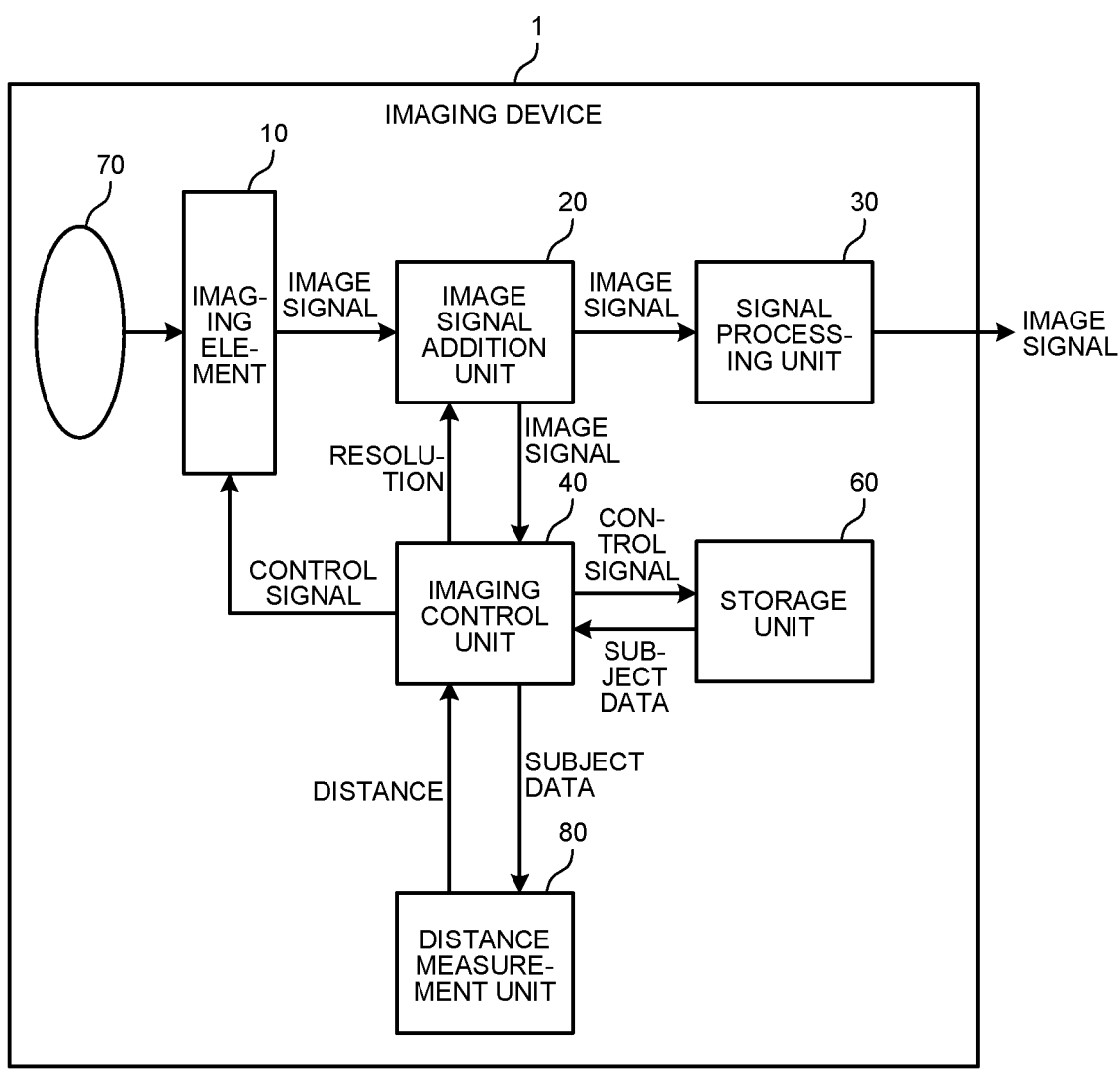
FIG. 9 illustrates a configuration example of an imaging device according to a second embodiment of the present disclosure.

FIG. 9 illustrates a configuration example of the imaging device according to the second embodiment of the present disclosure. As in FIG. 1, the figure is a block diagram illustrating a configuration example of the imaging device 1. The imaging device 1 in the figure is different from the imaging device 1 in FIG. 1 in that a distance measurement unit 80 is provided instead of the target region detection unit 50.

The distance measurement unit 80 measures a distance to a target. For example, a time of flight (ToF) sensor can be used for the distance measurement unit 80. The ToF sensor measures a distance to a target by applying light to a subject with a light source (not illustrated), detecting reflected light reflected from the subject, and measuring a light traveling time. Note that the distance measurement unit 80 is one example of the sensor described in the claims.

An imaging control unit 40 in the figure reads subject data from the storage unit 60, and outputs the subject data to the distance measurement unit 80. The distance measurement unit 80 recognizes a subject based on the subject data, and measures a distance. Thereafter, the distance measurement unit 80 outputs the measured distance to the imaging control unit 40. The imaging control unit 40 can select a resolution in accordance with the distance to the subject. For example, the imaging control unit 40 can use a first resolution as an initial value. When the distance to the subject is equal to or smaller than a predetermined threshold (first distance), the imaging control unit 40 can select a second resolution. Moreover, when the distance to the subject is equal to or smaller than a predetermined threshold (second distance), the imaging control unit 40 can select a third resolution.

[Imaging Processing]

Figure 10:
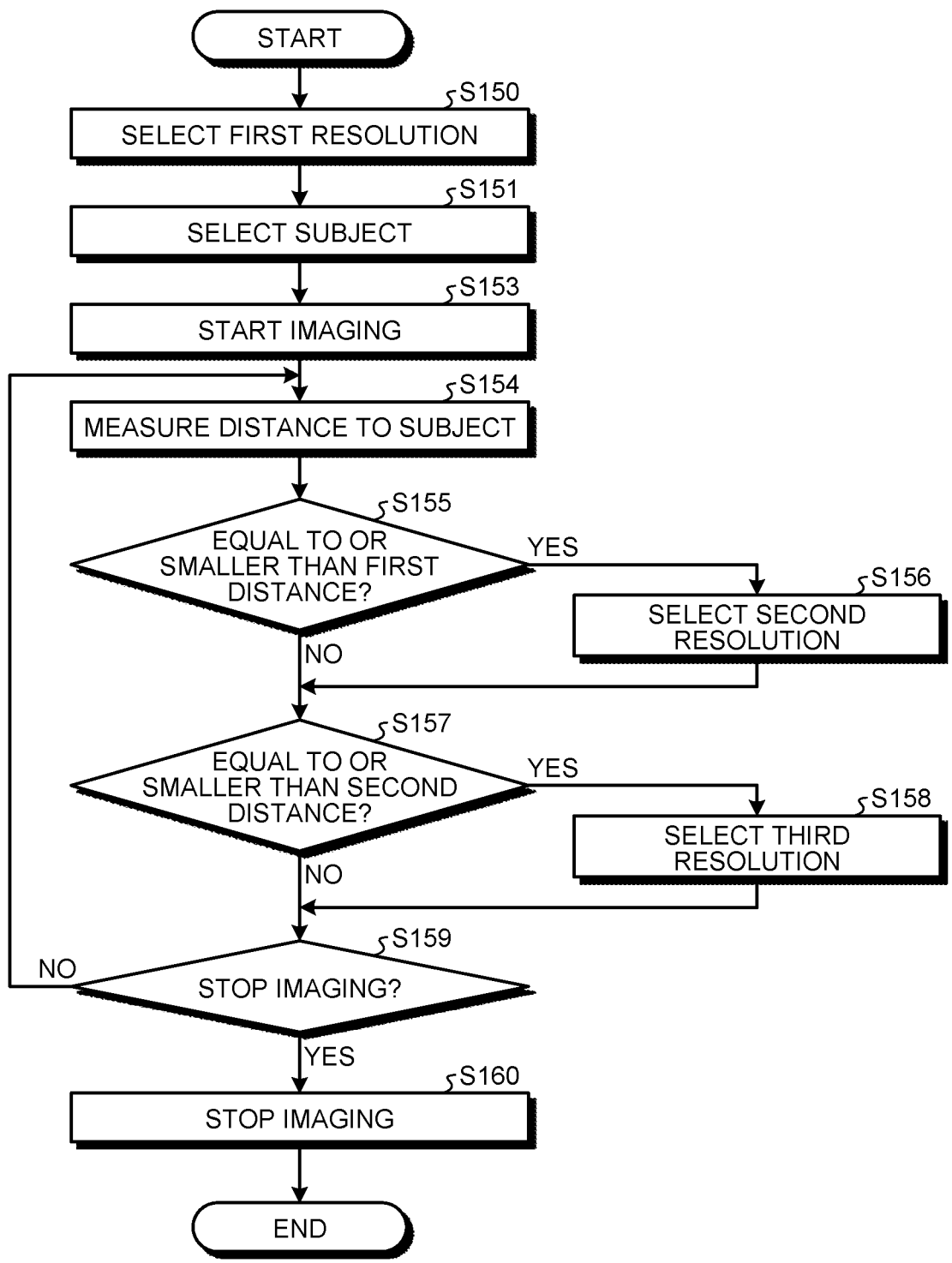
FIG. 10 illustrates one example of imaging processing according to the second embodiment of the present disclosure.

FIG. 10 illustrates one example of imaging processing according to the second embodiment of the present disclosure. The figure is a flowchart illustrating one example of imaging processing in the imaging device 1. First, the imaging control unit 40 selects the first resolution (Step S150). Next, the target region detection unit 50 selects a subject based on subject data in the storage unit 60 (Step S151). Data on the selected subject is output to the distance measurement unit 80. Next, the imaging control unit 40 controls an imaging element 10 to start imaging (Step S153). Next, the distance measurement unit 80 measures a distance to the subject (Step S154).

Next, the imaging control unit 40 determines whether or not the distance to the subject is equal to or smaller than the predetermined first distance (Step S155). When the distance to the subject is equal to or smaller than the first distance (Step S155, Yes), the imaging control unit 40 selects the second resolution (Step S156), and proceeds to processing of Step S157. In contrast, when the distance to the subject is larger than the first distance (Step S155, No), the processing proceeds to Step S157.

In Step S157, the imaging control unit 40 determines whether or not the distance to the subject is equal to or smaller than the predetermined second distance (Step S157). When the distance to the subject is equal to or smaller than the second distance (Step S157, Yes), the imaging control unit 40 selects the third resolution (Step S158), and proceeds to processing of Step S159. In contrast, when the distance to the subject is larger than the second distance (Step S157, No), the processing proceeds to Step S159.

In Step S159, the imaging control unit 40 determines whether or not to stop imaging (Step S159). This can be determined based on, for example, an operation to stop imaging performed by a user of the imaging device 1. When imaging is not stopped (Step S159, No), the processing proceeds to Step S154. When imaging is stopped (Step S159, Yes), the imaging control unit 40 controls the imaging element 10 to stop imaging (Step S160), and ends the imaging processing. The imaging device 1 can perform the imaging processing in the above-described procedure.

The other configuration of the imaging device 1 is similar to the configuration of the imaging device 1 in the first embodiment of the present disclosure, so that the description thereof will be omitted.

As described above, the imaging device 1 of the second embodiment of the present disclosure detects a distance to a subject with the distance measurement unit 80. This enables selection of a resolution in accordance with the distance to the subject.

3. Third Embodiment

The imaging device 1 of the first embodiment described above generates an image signal of a subject. In contrast, an imaging device 1 of a third embodiment of the present disclosure is different from that in the above-described first embodiment in that a focal position of the subject is further detected.

[Configuration of Imaging Device]

Figure 11:
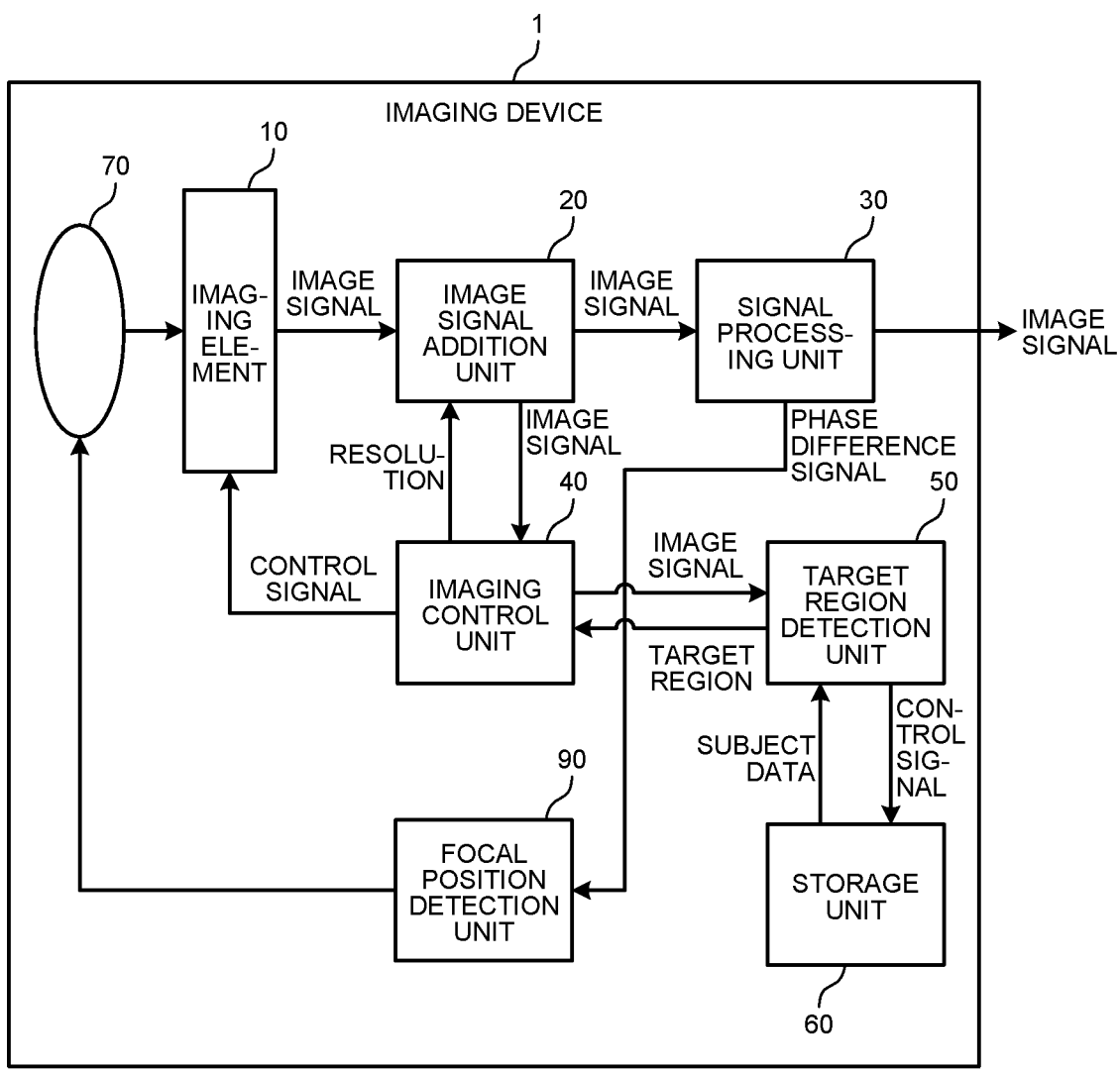
FIG. 11 illustrates a configuration example of an imaging device according to a third embodiment of the present disclosure.

FIG. 11 illustrates a configuration example of the imaging device according to the third embodiment of the present disclosure. As in FIG. 1, the figure is a block diagram illustrating a configuration example of the imaging device 1. The imaging device 1 in the figure further includes a focal position detection unit 90. The imaging device 1 is different from the imaging device 1 in FIG. 1 in that a signal processing unit 30 outputs a phase difference signal.

The signal processing unit 30 in the figure outputs a phase difference signal in addition to an image signal. The phase difference signal is used for detecting the focal position of an imaging lens 70. Autofocus can be performed by adjusting the position of the imaging lens 70 based on the focal position detected by the phase difference signal.

A pixel 100 of an imaging element 10 can be used as a phase difference pixel that generates a phase difference signal. As described in FIG. 3, light from a subject collected by the common on-chip lens 170 is incident on four pixels 100 constituting a pixel block 200. Therefore, the four pixels 100 arranged in the pixel block 200 can perform pupil division on the subject. Light transmitted through the left side of the imaging lens 70 is incident on right pixels 100 among the four pixels 100. Light transmitted through the right side of the imaging lens 70 is incident on left pixels 100. The focal position can be detected by detecting a phase difference between an image generated by image signals from right pixels 100 and an image generated by image signals from left pixels 100 in a plurality of pixel blocks 200.

Similarly, light transmitted through the lower side of the imaging lens 70 is incident on upper pixels 100 among the four pixels 100. Light transmitted through the upper side of the imaging lens 70 is incident on lower pixels 100. The focal position can be detected by detecting a phase difference between an image generated by image signals from upper pixels 100 and an image generated by image signals from lower pixels 100 in a plurality of pixel blocks 200. As described above, pupil division can be horizontally and vertically performed on the subject by the four pixels 100 arranged in the pixel block 200. The imaging element 10 can detect the focal position from two directions of the horizontal direction and the vertical direction. Furthermore, the imaging element 10 can use all the pixels 100 as phase difference pixels. Therefore, the imaging device 1 including the imaging element 10 can improve accuracy of detecting a focal position.

The signal processing unit 30 in the figure generates the phase difference signal, and outputs the phase difference signal to the focal position detection unit 90.

The focal position detection unit 90 detects the focal position based on the phase difference signal from the signal processing unit 30. Furthermore, the focal position detection unit 90 adjusts the position of the imaging lens 70 based on the detected focal position.

[Configuration of Signal Processing Unit]

Figure 12:
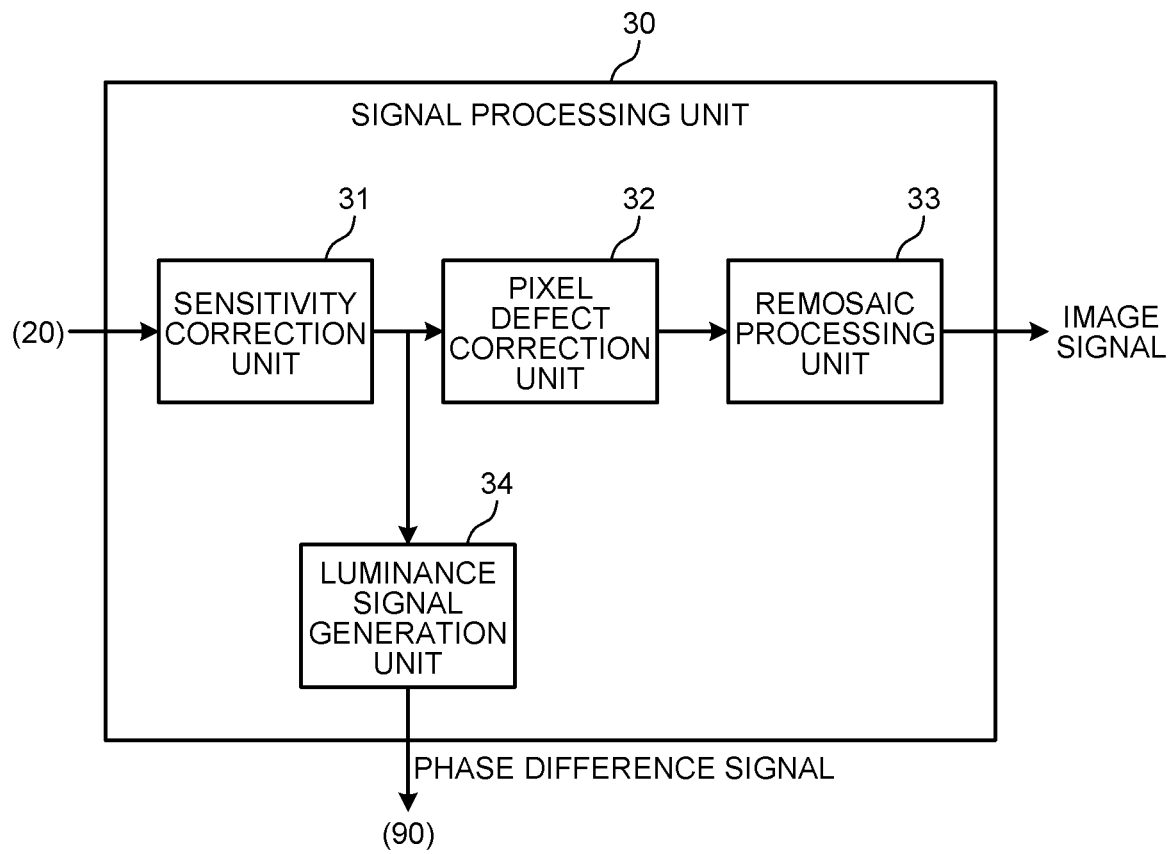
FIG. 12 illustrates a configuration example of a signal processing unit according to the third embodiment of the present disclosure.

FIG. 12 illustrates a configuration example of a signal processing unit according to the third embodiment of the present disclosure. As in FIG. 5, the figure is a block diagram illustrating a configuration example of the signal processing unit 30. The signal processing unit 30 in the figure is different from the signal processing unit 30 in FIG. 5 in that a luminance signal generation unit 34 is further provided.

The luminance signal generation unit 34 generates a luminance signal from a color image signal output from a sensitivity correction unit 31. The generated luminance signal is output to the focal position detection unit 90 as a phase difference signal.

[Configuration of Phase Difference Pixel]

Figure 13:
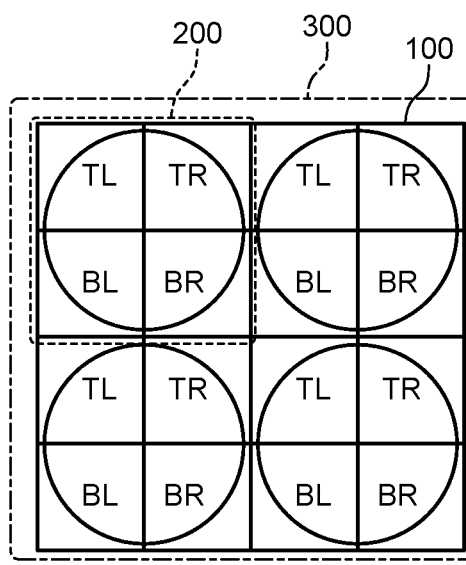
FIG. 13 illustrates a configuration example of a phase difference pixel according to the third embodiment of the present disclosure.

FIG. 13 illustrates a configuration example of a phase difference pixel according to the third embodiment of the present disclosure. The figure illustrates an example of arrangement of phase difference pixels in a case where the first resolution is applied. In the figure, "TL", "TR", "BL", and "BR" represent phase difference pixels of top left, top right, bottom left, and bottom right, respectively. Pupil division can be performed in the horizontal direction in the figure by phase difference pixels of "TL" and "TR" and "BL" and "BR". Furthermore, pupil division can be performed in the vertical direction in the figure by phase difference pixels of "TL" and "BL" and "TR" and "BR".

Figure 14A:
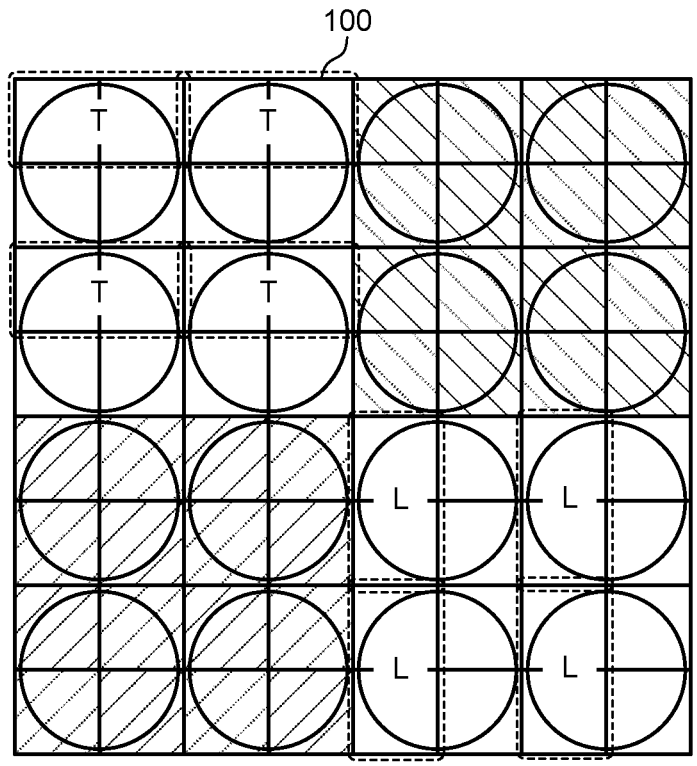
FIG. 14A illustrates a configuration example of the phase difference pixel according to the third embodiment of the present disclosure.
Figure 14B:
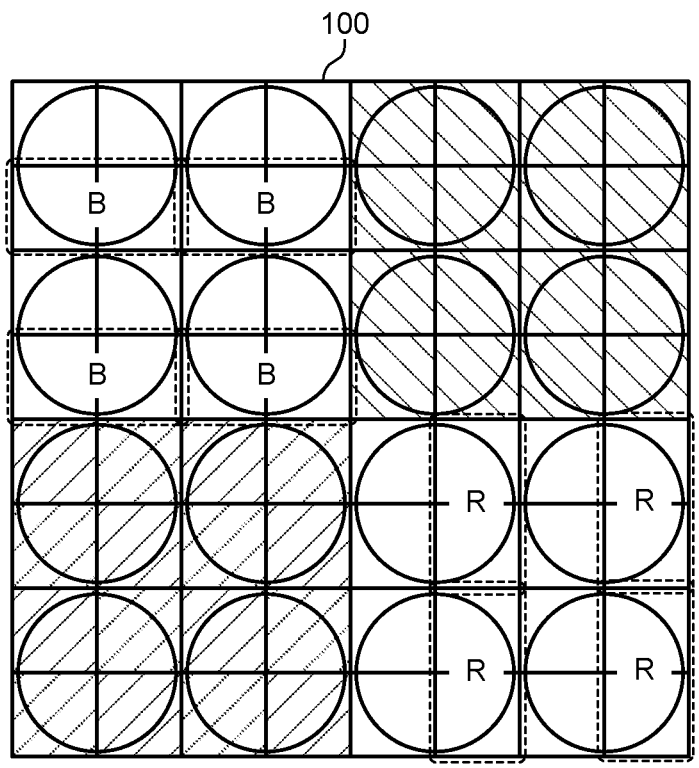
FIG. 14B illustrates a configuration example of the phase difference pixel according to the third embodiment of the present disclosure.

FIGS. 14A and 14B illustrate configuration examples of phase difference pixels according to the third embodiment of the present disclosure. The figure illustrates an example of arrangement of phase difference pixels in a case where the second resolution is applied. Furthermore, the figure illustrates an example in which a pixel 100 of a pixel block 200 for green light is used as a phase difference pixel. When the second resolution is applied, image signals of two adjacent pixels 100 of the pixel block 200 are added, and an image signal after the addition can be used as a phase difference signal (second phase difference signal). A dashed rectangle in the figure represents a pair of pixels 100 whose image signals are added. Note that the image signal addition unit 20 can add image signals. "T", "B", "L", and "R" in the figure represent phase difference pixels of top, bottom, left, and right, respectively. Pupil division can be performed in the vertical direction in the figure by a pair of pixels 100 of "T" in FIG. 14A and "B" in FIG. 14B. Furthermore, pupil division can be performed in the horizontal direction in the figure by a pair of pixels 100 of "L" in FIG. 14A and "R" in FIG. 14B.

Figure 15:
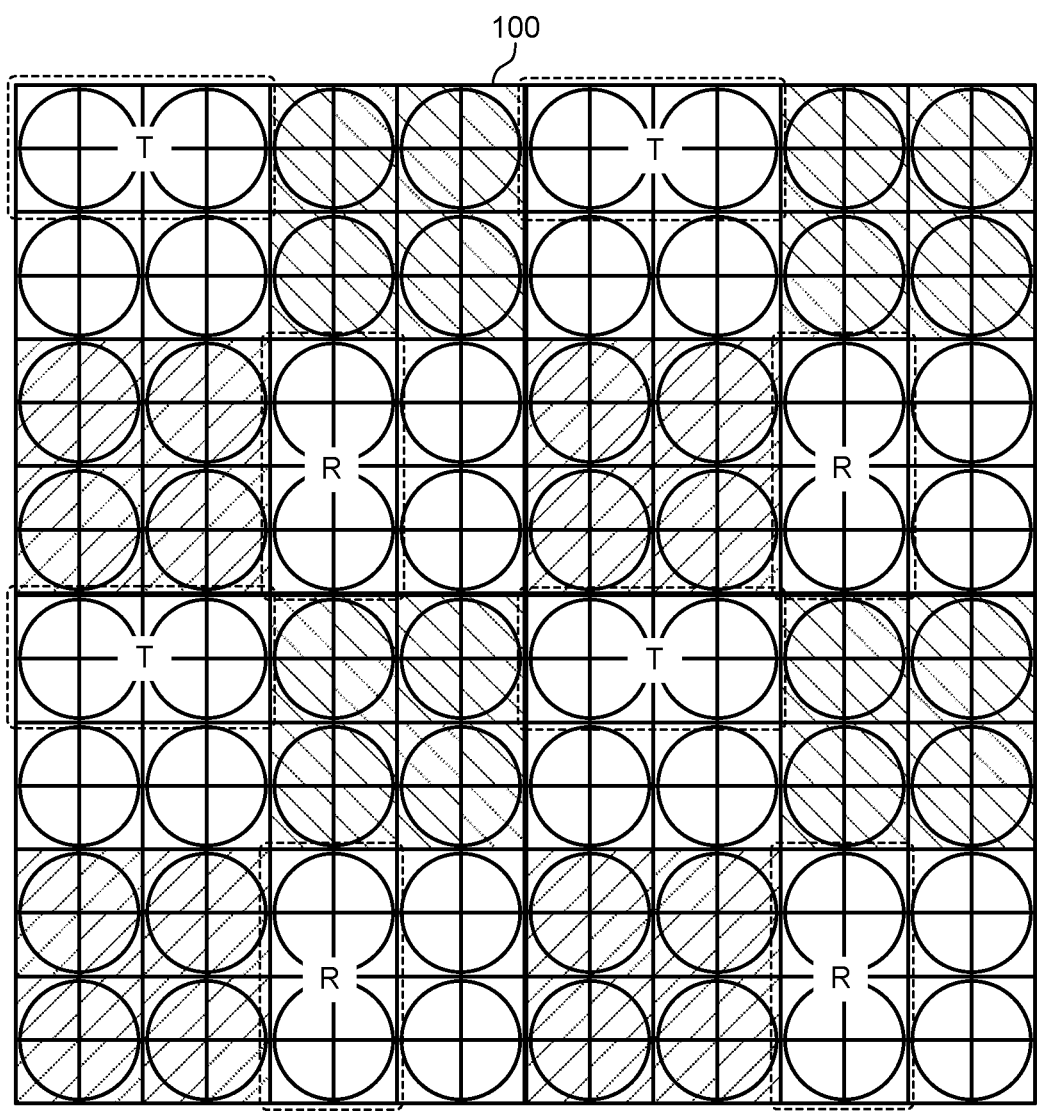
FIG. 15 illustrates a configuration example of the phase difference pixel according to the third embodiment of the present disclosure.

FIG. 15 illustrates a configuration example of a phase difference pixel according to the third embodiment of the present disclosure. The figure illustrates an example of arrangement of phase difference pixels in a case where the third resolution is applied. The figure illustrates an example in which a pixel 100 of a pixel block 200 for green light is used as a phase difference pixel. When the third resolution is applied, image signals of eight pixels 100 of two adjacent pixel blocks 200 are added, and an image signal after the addition can be used as a phase difference signal. A dashed rectangle in the figure represents a plurality of pixels 100 whose image signals are added. Note that the image signal addition unit 20 can add image signals. As in FIGS. 14A and 14B, "T" and "L" in the figure represent phase difference pixels. Note that description of phase difference pixels of "B" and "R" is omitted.

As described above, the imaging element 10 can generate phase difference signals in all the pixels 100 arranged in the pixel array unit 11. Furthermore, it is possible to generate a phase difference signal subjected to pupil division in two directions of the horizontal direction and the vertical direction.

Figure 16A:
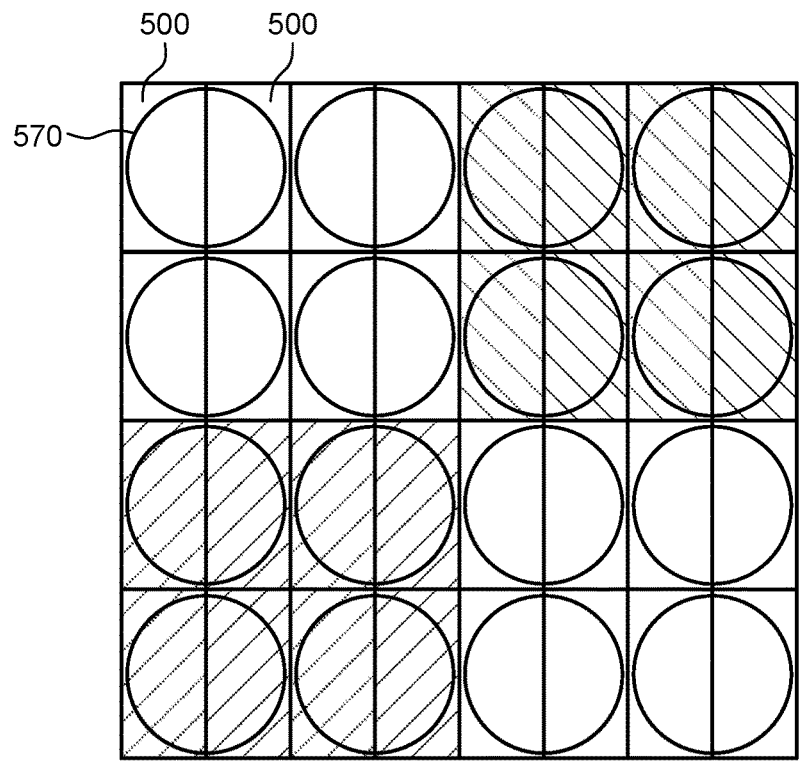
FIG. 16A illustrates a configuration example of an imaging element of a conventional technique.
Figure 16B:
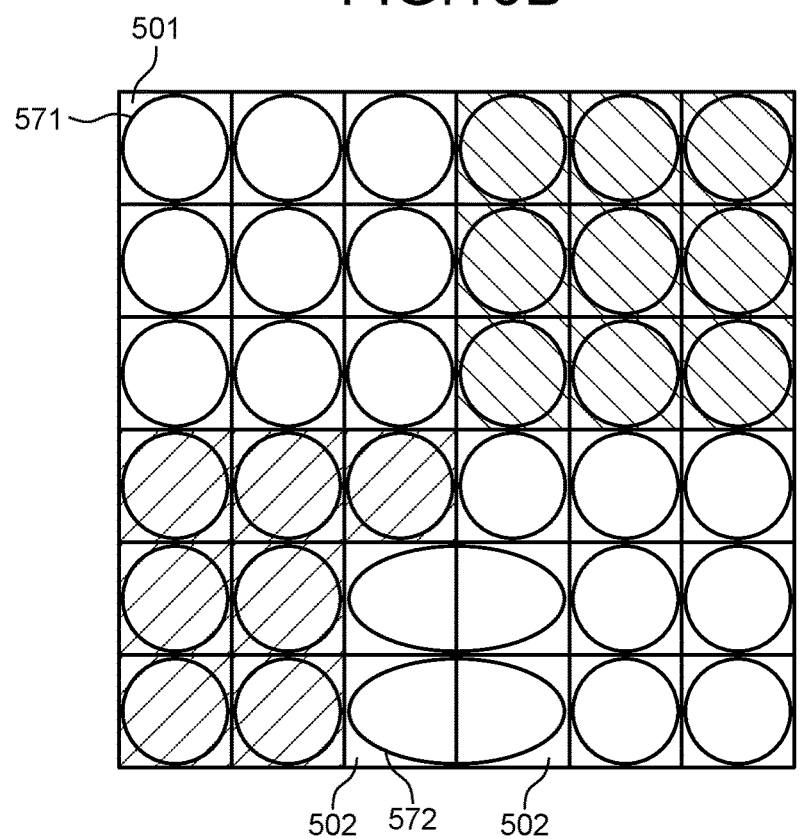
FIG. 16B illustrates a configuration example of the imaging element of the conventional technique.

FIGS. 16A and 16B illustrate configuration examples of an imaging element of a conventional technique. The figures illustrate examples of arrangement of pixels in a pixel array unit of an imaging element, which is a comparative example of the technique of the present disclosure.

FIG. 16A illustrates an example of a pixel array unit in which pixels 500 having a rectangular shape are arranged. An on-chip lens 570 is arranged in common in two pixels 500. The two pixels 500 constitute a phase difference pixel. In the pixel array unit in the figure, the phase difference signal can be generated in all the pixels. In the pixel array unit in the figure, however, pupil division can be performed only in one direction (horizontal direction in figure).

FIG. 16B illustrates an example of a pixel array unit in which pixels 501 including an on-chip lens 571 are arranged. In the pixel array unit in the figure, two pixels 502 in which the on-chip lens 571 is arranged in common constitute a phase difference pixel. In the pixel array unit in the figure, phase difference pixels are dispersedly arranged in a partial region. Furthermore, also in the pixel array unit in the figure, pupil division can be performed only in one direction (horizontal direction in figure).

As described above, since the imaging element of the comparative example supports pupil division in only one direction, a phase difference of a subject image having contrast in a direction different from the direction of the pupil division cannot be detected. Thus, accuracy of detecting a phase difference is decreased. Furthermore, since the imaging element including the pixel array unit in FIG. 16B has a restriction on the number of phase difference pixels, detection of a phase difference in imaging at a high resolution is difficult. In contrast, the imaging element 10 of the present disclosure can generate a phase difference signal in all the pixels 100 arranged in the pixel array unit 11, and generate a phase difference signal by performing pupil division in two directions of the horizontal direction and the vertical direction. This can improve the accuracy of detecting a phase difference. In particular, in imaging in a low-illuminance environment where a subject image has a low contrast, a higher phase difference can be detected than in the imaging element of a conventional technique.

The other configuration of the imaging device 1 is similar to the configuration of the imaging device 1 in the first embodiment of the present disclosure, so that the description thereof will be omitted.

As described above, the imaging device 1 of the third embodiment of the present disclosure generates a phase signal based on image signals added in accordance with a resolution of a target region, and detects a focal position. This enables autofocus for a subject in a target region imaged at a selected resolution. Convenience can be further improved.

4. Fourth Embodiment

The imaging device 1 of the first embodiment described above selects a resolution in accordance with a target region detected by the target region detection unit 50. In contrast, an imaging device 1 of a fourth embodiment of the present disclosure is different from that in the above-described first embodiment in that a resolution selected by a user of the imaging device 1 is applied.

[Configuration of Imaging Device]

Figure 17:
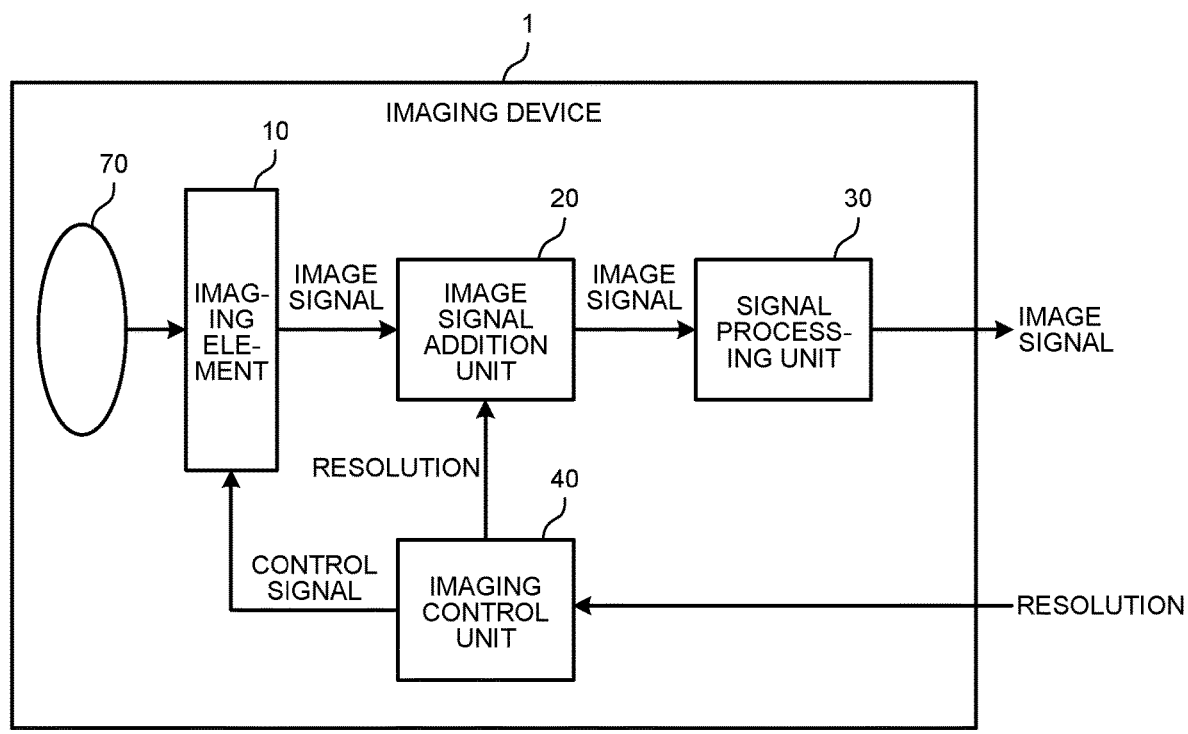
FIG. 17 illustrates a configuration example of an imaging device according to a fourth embodiment of the present disclosure.

FIG. 17 illustrates a configuration example of the imaging device according to the fourth embodiment of the present disclosure. As in FIG. 1, the figure is a block diagram illustrating a configuration example of the imaging device 1. The imaging device 1 in the figure is different from the imaging device 1 in FIG. 1 in that the target region detection unit 50 and the storage unit 60 are omitted.

A user of the imaging device 1 inputs a resolution to the imaging control unit 40 in the figure. The imaging control unit 40 in the figure outputs the input resolution to the image signal addition unit 20 as a selected resolution.

The other configuration of the imaging device 1 is similar to the configuration of the imaging device 1 in the first embodiment of the present disclosure, so that the description thereof will be omitted.

As described above, the imaging device 1 of the fourth embodiment of the present disclosure can perform imaging at the resolution selected by the user of the imaging device 1.

5. Fifth Embodiment

An example in which a resolution is selected in accordance with an illuminance and imaging is performed will be described.

[Configuration of Imaging Device]

Figure 18:
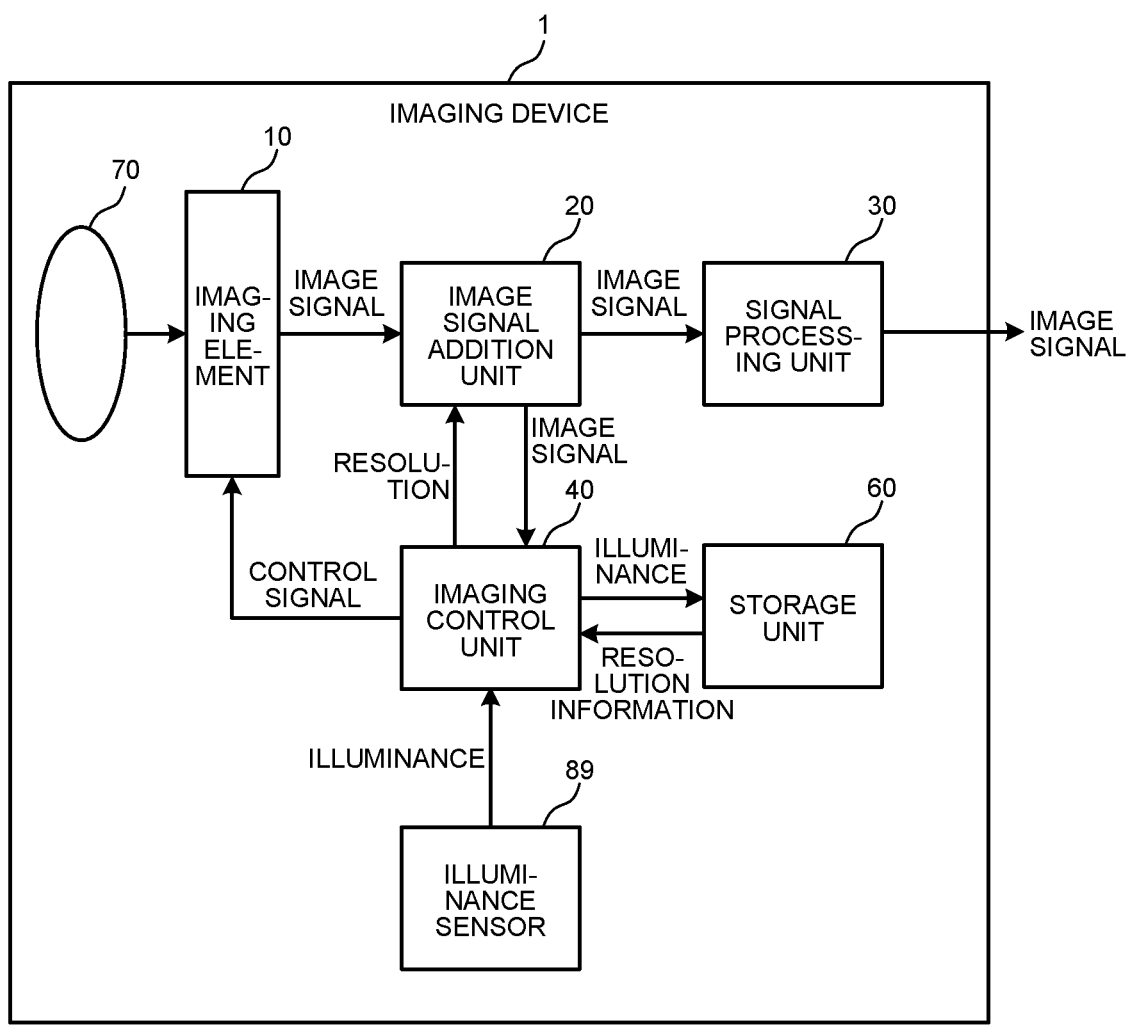
FIG. 18 illustrates a configuration example of an imaging device according to a fifth embodiment of the present disclosure.

FIG. 18 illustrates a configuration example of the imaging device according to a fifth embodiment of the present disclosure. As in FIG. 1, the figure is a block diagram illustrating a configuration example of the imaging device 1. The imaging device 1 in the figure is different from the imaging device 1 in FIG. 1 in that the target region detection unit 50 is omitted and an illuminance sensor 89 is provided. Note that, in the figure, the imaging control unit 40 and the storage unit 60 constitute an imaging control device.

The illuminance sensor 89 detects an illuminance. The illuminance sensor 89 outputs data of the detected illuminance to the imaging control unit 40.

The imaging control unit 40 in the figure selects a resolution in accordance with the illuminance input from the illuminance sensor 89. In this case, the imaging control unit 40 can select the resolution based on, for example, a threshold of the illuminance. Specifically, the imaging control unit 40 sets a first illuminance and a second illuminance as thresholds. Here, the second illuminance is a threshold lower than the first illuminance. Then, when the illuminance detected by the illuminance sensor 89 is equal to or greater than the first illuminance, when the illuminance is less than the first illuminance and equal to or greater than the second illuminance, and when the illuminance is less than the second illuminance, the imaging control unit 40 can select the first resolution, the second resolution, and the third resolution, respectively.

The storage unit 60 in the figure holds information on the correspondence relation between the threshold of the illuminance and the resolution. The imaging control unit 40 outputs the illuminance to the storage unit 60. Then, the storage unit 60 outputs the resolution in accordance with the illuminance to the imaging control unit 40. The imaging control unit 40 can select the output resolution.

The storage unit 60 in the figure holds the information on the correspondence relation between the threshold of the illuminance and the resolution described above. For example, the storage unit 60 can hold the information on the correspondence relation between the threshold of the illuminance and the resolution in a form of a look-up table (LUT) for referring to the relation between the threshold of the illuminance and the resolution.

As described above, in the second resolution, the image signal addition unit 20 adds four image signals, so that a level of an image signal can be made higher than that in the first resolution. Furthermore, in the third resolution, the image signal addition unit 20 adds 16 image signals, so that the level of an image signal can be further increased.

[Imaging Processing of Resolution]

Figure 19:
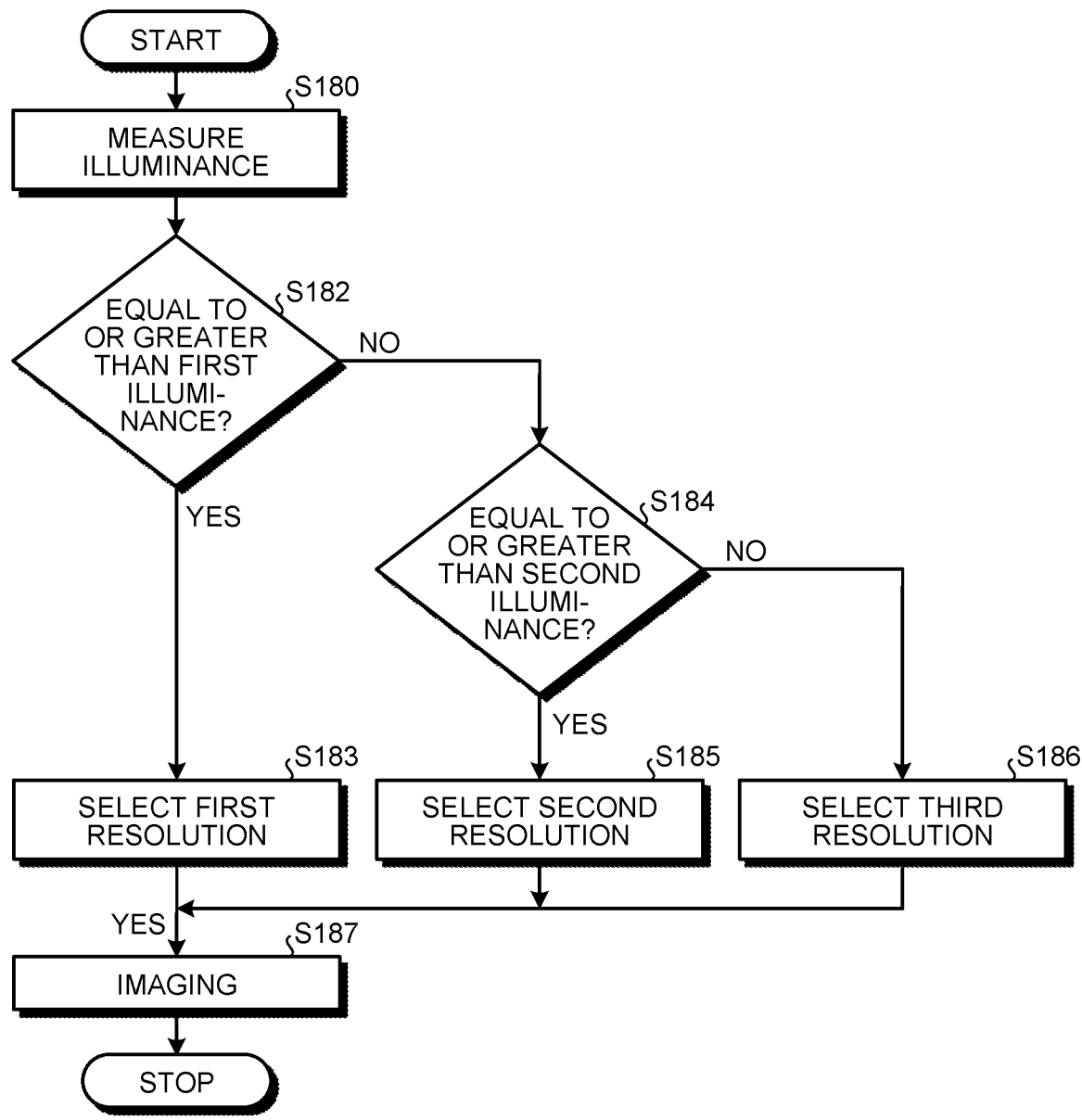
FIG. 19 illustrates one example of a processing procedure of imaging processing according to the fifth embodiment of the present disclosure.

FIG. 19 illustrates one example of a processing procedure of imaging processing according to the fifth embodiment of the present disclosure. The figure is a flowchart illustrating one example of the processing procedure of imaging processing in the imaging device 1. First, the illuminance sensor 89 measures an illuminance (Step S180). Next, the imaging control unit 40 determines whether the illuminance of the measurement result is equal to or greater than the first illuminance (Step S182). As a result, when the illuminance is equal to or greater than the first illuminance (Step S182, Yes), the imaging control unit 40 selects the first resolution (Step S183), and proceeds to processing of Step S187.

In contrast, when the illuminance is not equal to or greater than the first illuminance (Step S182, No), the imaging control unit 40 determines whether the illuminance is equal to or greater than the second illuminance (Step S184). As a result, when the illuminance is equal to or greater than the second illuminance (Step S184, Yes), the imaging control unit 40 selects the second resolution (Step S185), and proceeds to the processing of Step S187. In contrast, when the illuminance is not equal to or greater than the second illuminance (Step S184, No), the imaging control unit 40 selects the third resolution (Step S186), and proceeds to the processing of Step S187.

In Step S187, the imaging control unit 40 outputs a control signal to the imaging element 10 to cause the imaging element 10 to perform imaging (Step S187). The imaging processing can be performed by the above-described processing.

The other configuration of the imaging device 1 is similar to the configuration of the imaging device 1 in the first embodiment of the present disclosure, so that the description thereof will be omitted.

As described above, the imaging device 1 of the fifth embodiment of the present disclosure selects a resolution in accordance with an illuminance, and performs imaging. This enables imaging with improved sensitivity even in a low-illuminance environment.

6. Sixth Embodiment

An example in which a resolution is selected in accordance with exposure and imaging is performed will be described.

[Configuration of Imaging Device]

Figure 20:
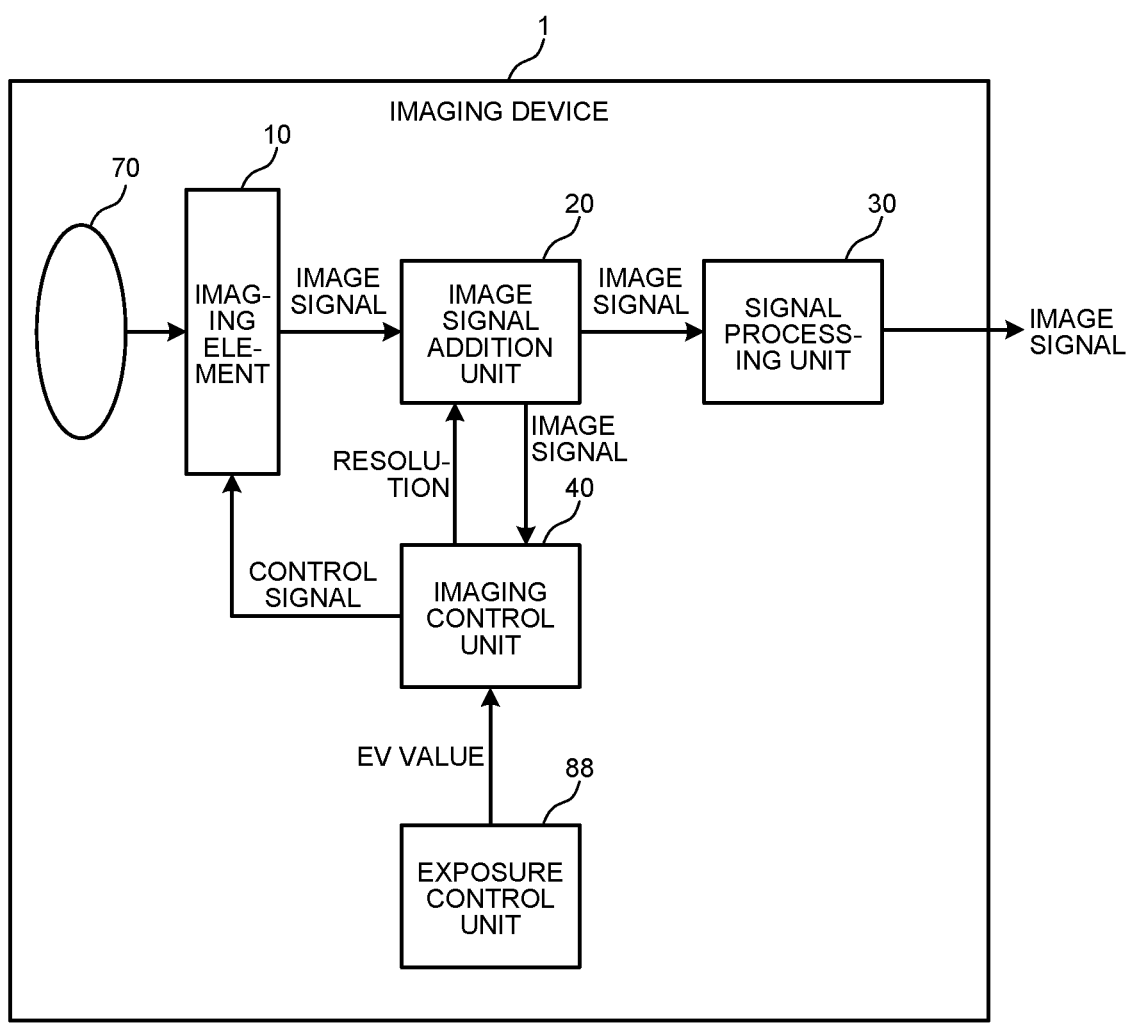
FIG. 20 illustrates a configuration example of an imaging device according to a sixth embodiment of the present disclosure.

FIG. 20 illustrates a configuration example of an imaging device according to a sixth embodiment of the present disclosure. As in FIG. 18, the figure is a block diagram illustrating a configuration example of an imaging device 1. The imaging device 1 in the figure is different from the imaging device 1 in FIG. 18 in that an exposure control unit 88 is provided instead of the illuminance sensor 89 and the storage unit 60.

The exposure control unit 88 controls exposure. The exposure control unit 88 controls exposure by detecting exposure (hereinafter, referred to as EV value) in accordance with set gain and shutter speed and outputting the EV value to the imaging control unit 40.

The imaging control unit 40 in the figure selects a resolution in accordance with the EV value input from the exposure control unit 88. In this case, the imaging control unit 40 can select the resolution based on, for example, a threshold of the EV value. Specifically, the imaging control unit 40 sets a first EV value and a second EV value as thresholds. Here, the second EV value is a threshold lower than the first EV value. Then, when the EV value detected by the exposure control unit 88 is equal to or greater than the first EV value, when the EV value is less than the first EV value and equal to or greater than the second EV value, and when the EV value is less than the second EV value, the imaging control unit 40 can select the first resolution, the second resolution, and the third resolution, respectively.

[Imaging Processing of Resolution]

Figure 21:
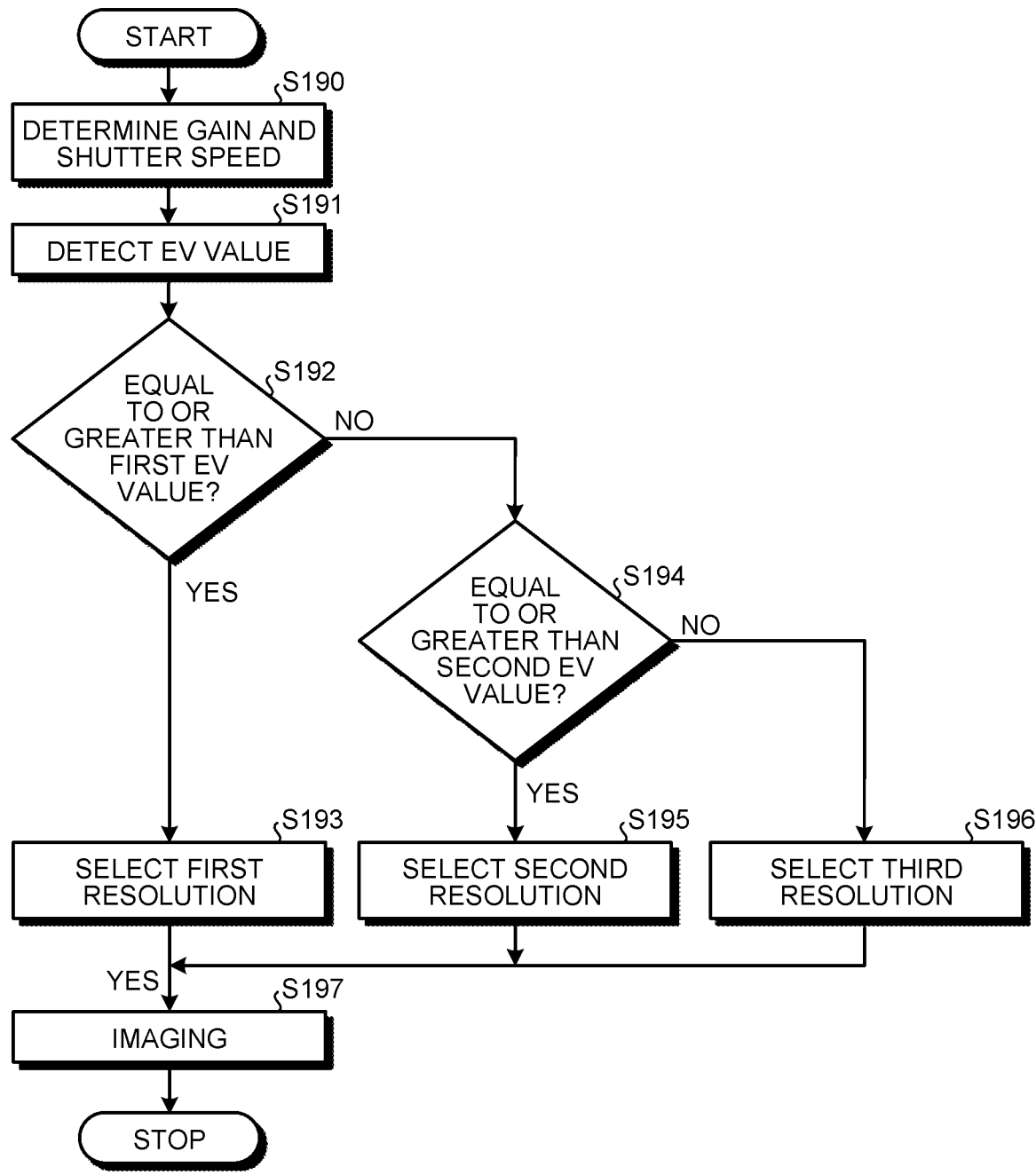
FIG. 21 illustrates one example of a processing procedure of imaging processing according to the sixth embodiment of the present disclosure.

FIG. 21 illustrates one example of a processing procedure of imaging processing according to the sixth embodiment of the present disclosure. The figure is a flowchart illustrating one example of the processing procedure of imaging processing in the imaging device 1. First, the imaging control unit 40 determines gain and shutter speed based on the level of an image signal (Step S190). Next, the exposure control unit 88 detects an EV value based on the determined gain and shutter speed (Step S191). Next, the imaging control unit 40 determines whether the detected EV value is equal to or greater than the first EV value (Step S192). As a result, when the detected EV value is equal to or greater than the first EV value (Step S192, Yes), the imaging control unit 40 selects the first resolution (Step S193), and proceeds to processing of Step S197.

In contrast, when the detected EV value is not equal to or greater than the first EV value (Step S192, No), the imaging control unit 40 determines whether the EV value is equal to or greater than the second EV value (Step S194). As a result, when the EV value is equal to or greater than the second EV value (Step S194, Yes), the imaging control unit 40 selects the second resolution (Step S195), and proceeds to the processing of Step S197. In contrast, when the EV value is not equal to or greater than the second EV value (Step S194, No), the imaging control unit 40 selects the third resolution (Step S196), and proceeds to the processing of Step S197.

In Step S197, the imaging control unit 40 outputs a control signal to the imaging element 10 to cause the imaging element 10 to perform imaging (Step S197). The imaging processing can be performed by the above-described processing.

The other configuration of the imaging device 1 is similar to the configuration of the imaging device 1 in the fifth embodiment of the present disclosure, so that the description thereof will be omitted.

As described above, the imaging device 1 of the sixth embodiment of the present disclosure selects a resolution in accordance with an EV value, and performs imaging. This enables imaging in accordance with exposure.

7. Seventh Embodiment

In the imaging device 1 of the first embodiment described above, the imaging control unit 40 selects a resolution in accordance with a target region detected by the target region detection unit 50. In contrast, an imaging device 1 of a seventh embodiment of the present disclosure is different from that in the above-described first embodiment in that a plurality of target regions is detected.

The imaging device 1 of the seventh embodiment of the present disclosure can have configuration similar to that of the imaging device 1 in FIG. 1. Furthermore, the target region detection unit 50 of the seventh embodiment of the present disclosure can detect a plurality of target regions. Furthermore, the imaging control unit 40 of the seventh embodiment of the present disclosure can select a resolution for each detected target region.

[Example of Image]

Figure 22:
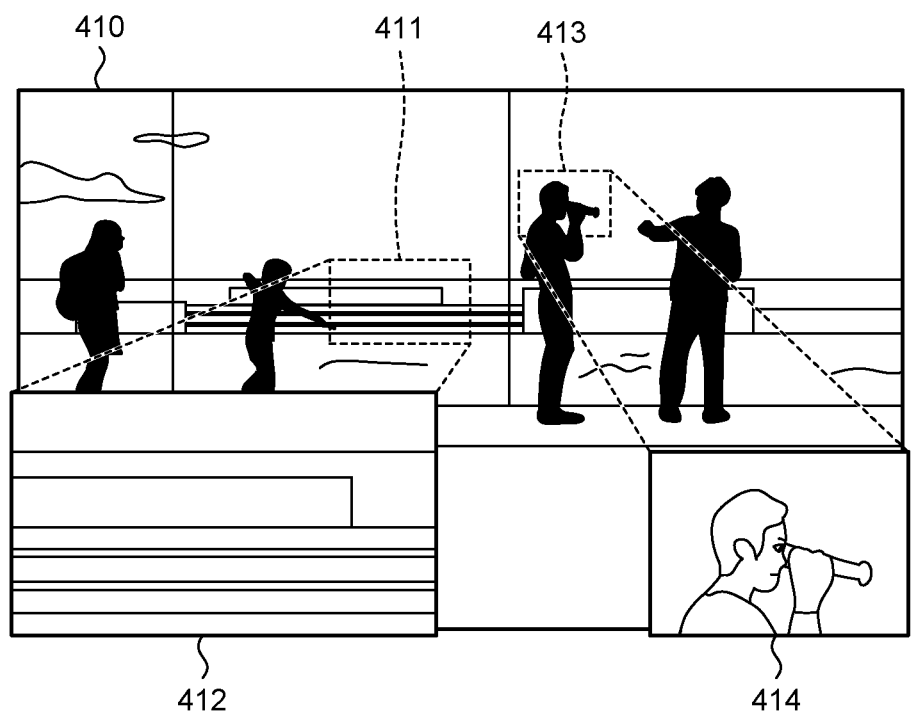
FIG. 22 illustrates one example of an image generated by an imaging device according to a seventh embodiment of the present disclosure.

FIG. 22 illustrates one example of an image generated by the imaging device according to the seventh embodiment of the present disclosure. As in FIG. 7B, the figure illustrates an example in which an image of a target region set to have a different resolution is superimposed on the generated image. An image 410 in the figure is generated at, for example, the second resolution. The image 410 illustrates an example of a case where a person is imaged from the inside of a building with an outside scene being set as a background. Since being backlit, a dark image of a person is generated. In this image, the target region detection unit 50 detects target regions 411 and 413, and the target regions 411 and 413 are output to the imaging control unit 40. The imaging control unit 40 can generate an image 412 and an image 414. The image 412 is enlarged by applying the first resolution to the target region 411. The luminance of the image 414 is improved by applying the third resolution to the target region 413.

A distant subject can be confirmed by generating the image 412. Furthermore, visibility of a subject darkened due to backlight can be improved by generating the image 414.

The other configuration of the imaging device 1 is similar to the configuration of the imaging device 1 in the first embodiment of the present disclosure, so that the description thereof will be omitted.

As described above, the imaging device 1 of the seventh embodiment of the present disclosure selects a resolution for each of a plurality of target regions. This enables improvement of convenience.

8. Variations

Next, variations of an embodiment of the present disclosure will be described.

[Configuration in Plane of Imaging Element]

Figure 23:
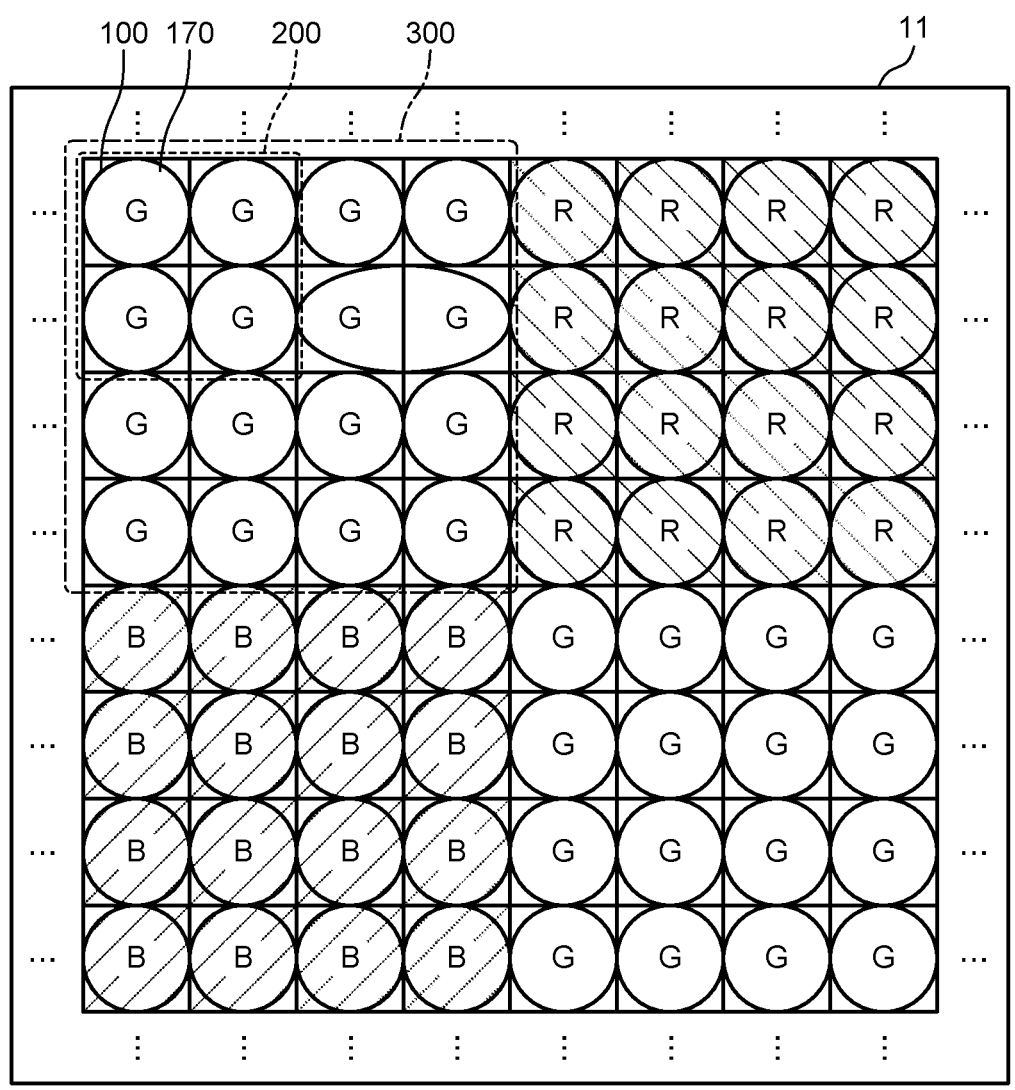
FIG. 23 illustrates a configuration example of a pixel according to a first variation of an embodiment of the present disclosure.

FIG. 23 illustrates a configuration example of a pixel according to a first variation of the embodiment of the present disclosure. As in FIG. 3, the figure is a plan view illustrating a configuration example of pixels 100 arranged in a pixel array unit 11. The pixels 100 in the figure are different from the pixels 100 in FIG. 3 in that each of the pixels 100 except for pixels 100 constituting phase difference pixels includes an on-chip lens 170. Pixels 100 having a common on-chip lens 170 constituting phase difference pixels are arranged in one of pixel block units 300 for green light arranged in the Bayer array. Furthermore, the pixels 100 constituting the phase difference pixels are arranged in one pixel block 200 among four pixel blocks 200 constituting the pixel block unit 300.

Figure 24:
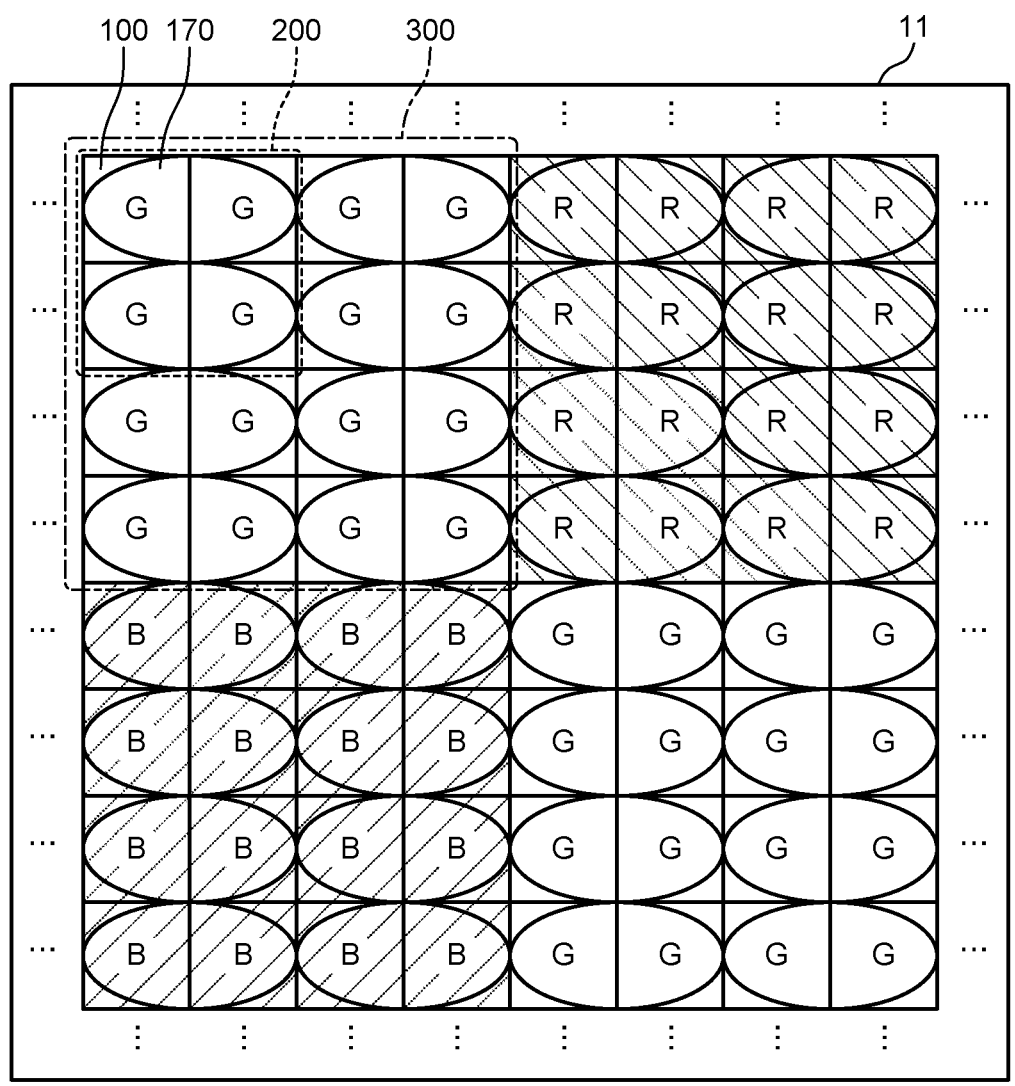
FIG. 24 illustrates a configuration example of a pixel according to a second variation of the embodiment of the present disclosure.
Figure 25:
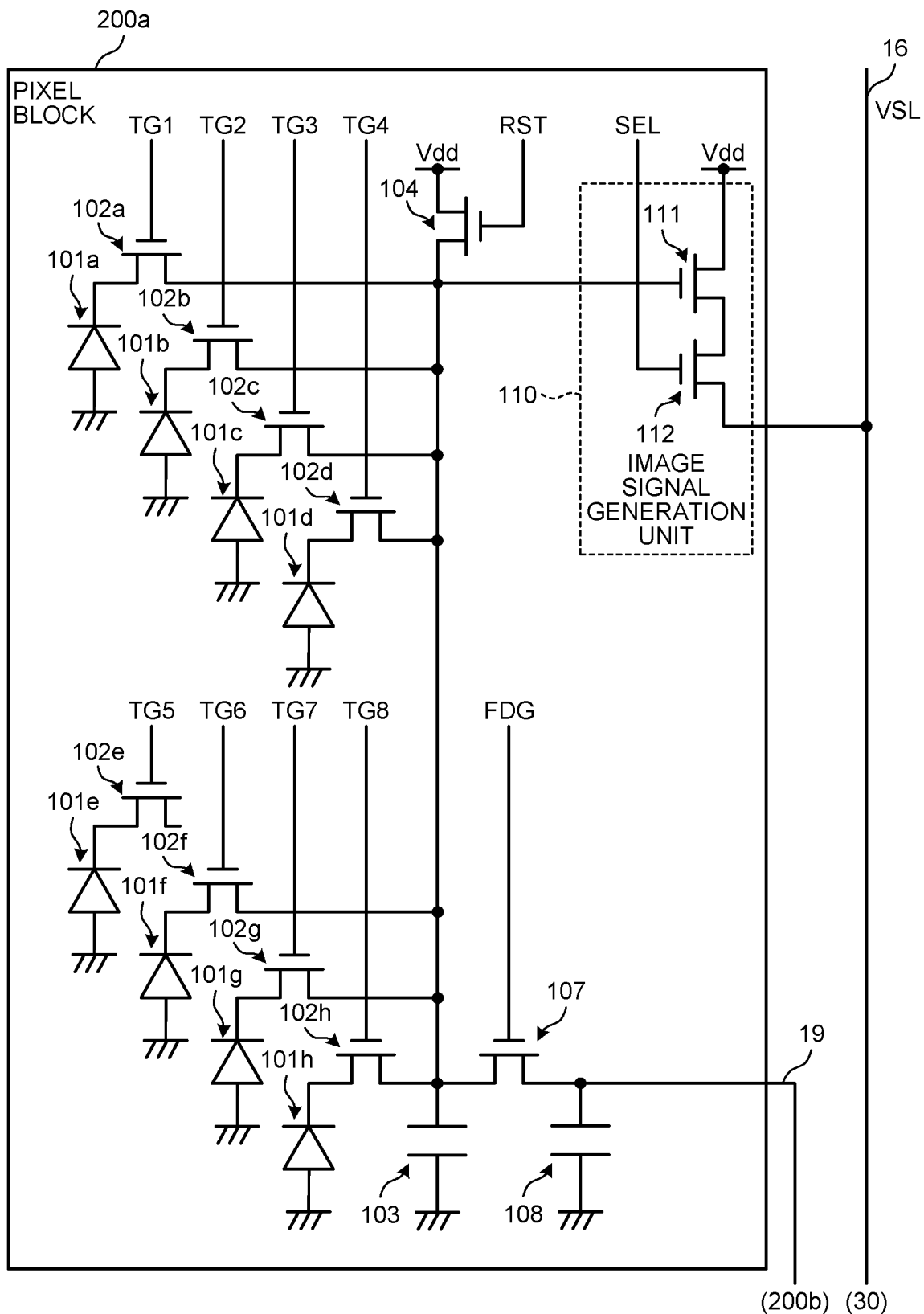
FIG. 25 illustrates one example of a circuit configuration of a pixel block according to the embodiment of the present disclosure.

FIG. 24 illustrates a configuration example of a pixel according to a second variation of the embodiment of the present disclosure. As in FIG. 3, the figure is a plan view illustrating a configuration example of pixels 100 arranged in a pixel array unit 11. A pixel block 200 in the figure is different from the pixel block 200 in FIG. 3 in that the pixel block 200 in the figure includes pixels 100 constituting phase difference pixels.

Also in the pixel array unit 11 in FIGS. 23 and 24, similarly to the pixel array unit 11 in FIG. 3, image signals in accordance with the first resolution, the second resolution, and the third resolution can be generated.

9. Configuration Example of Pixel Block

A circuit example of a pixel block 200 according to the embodiment of the present disclosure will be described.

[Circuit Configuration of Pixel Block]

A figure illustrates one example of a circuit configuration of the pixel block according to the embodiment of the present disclosure. The figure illustrates one example of a circuit configuration in which an image signal generation unit 110 is arranged in each of the two pixel blocks 200. A pixel block 200a in the figure includes photoelectric conversion units 101a, 101b, 101c, 101d, 101e, 101f, 101g, and 101h and charge transfer units 102a, 102b, 102c, 102d, 102e, 102f, 102g, and 102h. Furthermore, the pixel block 200a further includes a charge holding unit 103, a reset unit 104, an image signal generation unit 110, an auxiliary charge holding unit 108, a coupling unit 107, and an image signal generation unit 110. Note that the image signal generation unit 110 includes an amplification transistor 111 and a selection transistor 112.

Note that the photoelectric conversion unit 101a and the charge transfer unit 102a and the photoelectric conversion unit 101b and the charge transfer unit 102b constitute a pixel 100a and a pixel 100b (not illustrated), respectively. Furthermore, the photoelectric conversion unit 101c and the charge transfer unit 102c and the photoelectric conversion unit 101d and the charge transfer unit 102d constitute a pixel 100c and a pixel 100d (not illustrated), respectively. These pixels 100a to 100d constitute a pixel block.

Similarly, the photoelectric conversion unit 101e and the charge transfer unit 102e and the photoelectric conversion unit 101f and the charge transfer unit 102f constitute a pixel 100e and a pixel 100f (not illustrated), respectively. Furthermore, the photoelectric conversion unit 101g and the charge transfer unit 102g and the photoelectric conversion unit 101h and the charge transfer unit 102h constitute a pixel 100g and a pixel 100h (not illustrated), respectively. These pixels 100e to 100h constitute a pixel block.

The charge transfer units 102a to 102h, the reset unit 104, the amplification transistor 111, the selection transistor 112, and the coupling unit 107 can include n-channel MOS transistors.

The signal lines 15 and 16 described in FIG. 2 are arranged in the pixel block 200a. The signal line 15 in the figure includes a signal line TG1, a signal line TG2, a signal line TG3, a signal line TG4, a signal line TG5, a signal line TG6, a signal line TG7, a signal line TG8, a signal line FDG, a signal line RST, and a signal line SEL. Furthermore, the signal line 16 includes a signal line VSL. Furthermore, a signal line 19 is further arranged in the pixel block 200a. The signal line 19 connects the pixel block 200a with other pixel blocks 200 (pixel blocks 200b, 200c, and 200d to be described later). In addition, a power supply line Vdd is arranged in the pixel block 200a. The power supply line Vdd is a wire that supplies power to the pixel block 200a.

An anode of the photoelectric conversion unit 101a is grounded, and a cathode thereof is connected to a source of the charge transfer unit 102a. An anode of the photoelectric conversion unit 101b is grounded, and a cathode thereof is connected to a source of the charge transfer unit 102b. An anode of the photoelectric conversion unit 101c is grounded, and a cathode thereof is connected to a source of the charge transfer unit 102c. An anode of the photoelectric conversion unit 101d is grounded, and a cathode thereof is connected to a source of the charge transfer unit 102d. An anode of the photoelectric conversion unit 101e is grounded, and a cathode thereof is connected to a source of the charge transfer unit 102e. An anode of the photoelectric conversion unit 101f is grounded, and a cathode thereof is connected to a source of the charge transfer unit 102f. An anode of the photoelectric conversion unit 101g is grounded, and a cathode thereof is connected to a source of the charge transfer unit 102g. An anode of the photoelectric conversion unit 101h is grounded, and a cathode thereof is connected to a source of the charge transfer unit 102h.

Drains of the charge transfer unit 102a, the charge transfer unit 102b, the charge transfer unit 102c, the charge transfer unit 102d, the charge transfer unit 102e, the charge transfer unit 102f, the charge transfer unit 102g, and the charge transfer unit 102h are connected in common to one end of the charge holding unit 103. Furthermore, a gate of the amplification transistor 111, a source of the reset unit 104, and a drain of the coupling unit 107 are further connected to one end of the charge holding unit 103. The other end of the charge holding unit 103 is grounded. A drain of the reset unit 104 and a drain of the amplification transistor 111 are connected to the power supply line Vdd. A source of the amplification transistor 111 is connected to a drain of the selection transistor 112. A source of the selection transistor 112 is connected to the signal line VSL.

A gate of the charge transfer unit 102a is connected to the signal line TG1. A gate of the charge transfer unit 102b is connected to the signal line TG2. A gate of the charge transfer unit 102c is connected to the signal line TG3. A gate of the charge transfer unit 102d is connected to the signal line TG4. A gate of the charge transfer unit 102e is connected to the signal line TG5. A gate of the charge transfer unit 102f is connected to the signal line TG6. A gate of the charge transfer unit 102g is connected to the signal line TG7. A gate of the charge transfer unit 102h is connected to the signal line TG8. A gate of the reset unit 104 is connected to the signal line RST. A gate of the coupling unit 107 is connected to the signal line FDG. One end of the auxiliary charge holding unit 108 is grounded, and the other end thereof is connected to a source of the coupling unit 107 and the signal line 19.

The photoelectric conversion unit 101a and the like perform photoelectric conversion on incident light. The photoelectric conversion unit 101a and the like can include a photodiode.

The charge holding unit 103 holds a charge generated by photoelectric conversion of the photoelectric conversion unit 101a and the like. The charge holding unit 103 can include a semiconductor region formed on a semiconductor substrate.

The charge transfer unit 102a and the like transfer the charge from the photoelectric conversion unit 101a and the like to the charge holding unit 103. A control signal from the charge transfer unit 102a or the like is transmitted by the signal line TG1 or the like.

The reset unit 104 resets the charge holding unit 103. The reset can be performed by establishing conduction between the charge holding unit 103 and the power supply line Vdd and discharging the charge of the charge holding unit 103. A control signal from the reset unit 104 is transmitted by the signal line RST.

The amplification transistor 111 amplifies the voltage of the charge holding unit 103. The gate of the amplification transistor 111 is connected to the charge holding unit 103. Therefore, an image signal having a voltage in accordance with the charge held in the charge holding unit 103 is generated at the source of the amplification transistor 111. Furthermore, the image signal can be output to the signal line VSL by making the selection transistor 112 conductive. A control signal from the selection transistor 112 is transmitted by the signal line SEL.

The auxiliary charge holding unit 108 is a capacitor coupled to the charge holding unit 103. Charge holding capacity of the pixel block 200a can be adjusted by coupling the auxiliary charge holding unit 108 with the charge holding unit 103. Specifically, when the auxiliary charge holding unit 108 is coupled to the charge holding unit 103, the charge holding capacity of the pixel block 200a increases. This can reduce the sensitivity of the pixel block 200a. When the auxiliary charge holding unit 108 is not coupled to the charge holding unit 103, the charge holding capacity of the pixel block 200a is relatively increased while saturation of charges easily occurs. An operation mode in which the auxiliary charge holding unit 108 is not coupled to the charge holding unit 103 and an operation mode in which the auxiliary charge holding unit 108 is coupled to the charge holding unit 103 are referred to as a high-sensitivity mode and a low-sensitivity mode, respectively.

The coupling unit 107 couples the auxiliary charge holding unit 108 to the charge holding unit 103. The coupling unit 107 includes a MOS transistor, and can couple the auxiliary charge holding unit 108 with the charge holding unit 103 by establishing conduction between the charge holding unit 103 and the auxiliary charge holding unit 108.

Note that auxiliary charge holding units 108 of the pixel block 200a in the figure, and a pixel block 200b, a pixel block 200c, and a pixel block 200d to be described later are connected by the signal line 19.

As described above, the charge transfer unit 102, the reset unit 104, the selection transistor 112, and the coupling unit 107 can include n-channel MOS transistors. In this n-channel MOS transistor, conduction between a drain and a source can be established by applying, to a gate, a voltage exceeding a threshold of a voltage Vgs between the gate and the source. Hereinafter, the voltage exceeding the threshold of the voltage Vgs between the gate and the source is referred to as an ON voltage. In contrast, a voltage that brings the MOS transistor into a non-conductive state is referred to as an OFF voltage. Control signals including the ON voltage and the OFF voltage are transmitted by the signal line TG1 and the like.

Furthermore, when resetting the charge holding unit 103, the reset unit 104 can also reset the photoelectric conversion unit 101 by making the charge transfer unit 102 conductive. Furthermore, the auxiliary charge holding unit 108 can be reset by making the coupling unit 107 conductive. The auxiliary charge holding unit 108 can be reset in an own pixel block charge holding period and a charge non-holding period. In the own pixel block charge holding period, a charge is held in a charge holding unit 103 of a pixel block 200. In the charge non-holding period, a charge is not held in any of charge holding units 103 of pixel blocks 200.

[Configuration of Pixel Block]

Figure 26:
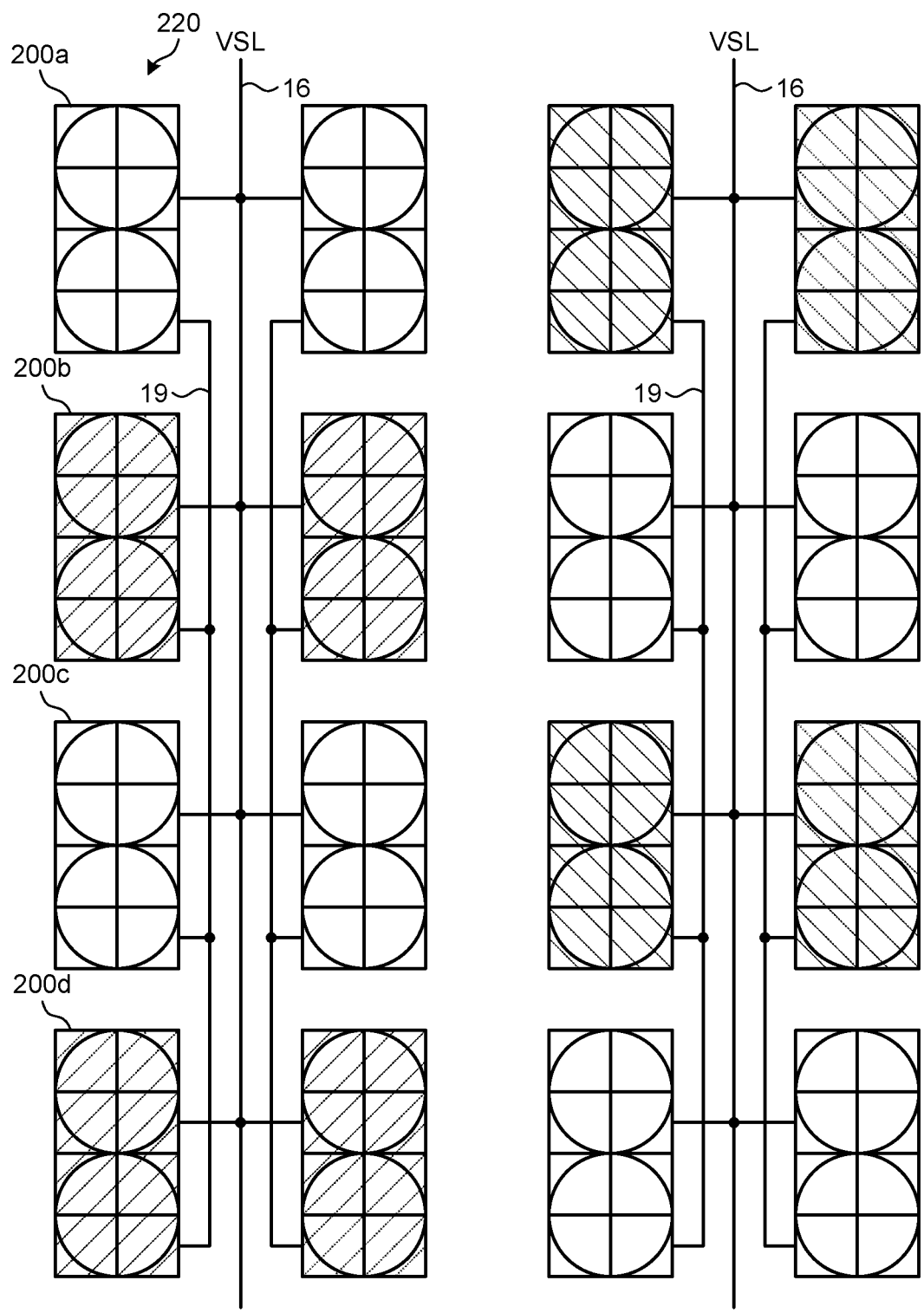
FIG. 26 illustrates a configuration example of the pixel block according to the embodiment of the present disclosure.

FIG. 26 illustrates a configuration example of a pixel block according to the embodiment of the present disclosure. The figure illustrates a configuration example of the pixel blocks 200a, 200b, 200c, and 200d. In the pixel block 200a and the like in the figure, two sets of four pixels 100 arranged in two rows and two columns are arranged. An on-chip lens 170 is arranged in common in the four pixels 100. The pixel blocks 200b, 200c, and 200d in the figure have a circuit common to that of the pixel block 200a. Furthermore, two sets of pixel blocks 200a, 200b, 200c, and 200d are connected in common to the signal line 16 (signal line VSL) described in FIG. 2.

Note that the configuration of the second embodiment of the present disclosure can be applied to other embodiments. Specifically, the distance measurement unit 80 in FIG. 9 can be applied to the third embodiment of the present disclosure.

(Effects)

The imaging device 1 includes the imaging element 10, a resolution selection unit (imaging control unit 40), and the image signal addition unit 20. In the imaging element 10, pixel blocks 200 are arranged in a two-dimensional matrix. The pixel blocks 200 include a plurality of pixels 100 and the on-chip lens 170. The plurality of pixels 100 performs photoelectric conversion on incident light from a subject, and generates an image signal. The on-chip lens 170 is arranged in common in the plurality of pixels 100, and collects the incident light on the plurality of pixels 100. The resolution selection unit (imaging control unit 40) selects a first resolution, a second resolution, and a third resolution. The first resolution is in accordance with the size of the pixels 100. The second resolution is in accordance with the size of the pixel blocks 200. The third resolution is in accordance with the size of a pixel block unit 300 including a plurality of adjacent pixel blocks 200. The image signal addition unit 20 generates a second image signal by adding the generated image signals in accordance with the selected resolution. This produces an effect of generating image signals having different resolutions.

Furthermore, one of a plurality of color filters that transmit beams of incident light of different wavelengths may be arranged in a pixel 100. This enables generation of a color image signal.

Furthermore, a color filter that transmits beams of incident light of the same wavelength on each pixel 100 of a plurality of pixel blocks 200 of the pixel block unit 300 itself may be arranged in the pixel block unit 300. This enables wavelengths of beams of incident light supported by the pixels 100 of the pixel block 200 to be attuned.

Furthermore, the plurality of color filters may be arranged in an array in a predetermined arrangement order in the plurality of pixels 100.

Furthermore, a signal processing unit that performs remosaic processing may be further provided. In the remosaic processing, an image signal is converted into an image signal in an array of an arrangement order of a plurality of color filters different from the array. This enables generation of an image signal in accordance with a desired array of color filters.

Furthermore, the signal processing unit may perform the remosaic processing in accordance with the selected resolution. This enables selection of the remosaic processing in accordance with a resolution.

Furthermore, the target region detection unit 50 may be further provided. The target region detection unit 50 detects a target region, which is a region of an image including a target to be imaged among subjects in an image including generated image signals. The resolution selection unit (imaging control unit 40) may select a resolution in accordance with the detected target region. This enables adjustment of a resolution of a desired target to be imaged.

Furthermore, the target region detection unit 50 may detect the target region based on an instruction of a user.

Furthermore, the target region detection unit 50 may detect a target region from a preliminarily generated image.

Furthermore, a sensor that measures a distance to a subject may be further provided. The resolution selection unit (imaging control unit 40) may select a resolution in accordance with a measured distance. This enables automation of processing of enlargement and reduction in accordance with the distance to the subject.

Furthermore, the resolution selection unit (imaging control unit 40) may select a resolution in accordance with a frame rate of an image at the time of generating a moving image, which is generated by a plurality of images generated in time series. This enables selection of a resolution in accordance with a data amount of the moving image.

Furthermore, the pixel 100 may further generate phase difference signals for detecting an image plane phase difference by performing pupil division on a subject. The image signal addition unit 20 may generate a second phase difference signal by adding the generated phase difference signals in accordance with the selected resolution. This enables generation of a phase difference signal in accordance with a resolution.

Furthermore, the image signal addition unit 20 may add phase difference signals generated by two adjacent pixels 100 of the pixel block 200 when the second resolution is selected, and may add phase difference signals generated by a plurality of pixels 100 arranged in two adjacent pixel blocks 200 when the third resolution is selected.

Furthermore, the pixel block 200 may include four pixels 100 arranged in two rows and two columns.

The imaging device 1 includes a plurality of pixels 100 and a plurality of on-chip lenses 170. The plurality of pixels 100 is arranged in a two-dimensional matrix. The plurality of pixels 100 performs photoelectric conversion on incident light, and generates an image signal. The plurality of on-chip lenses 170 is arranged for each pixel block 200 including four pixels 100 arranged in two rows and two columns. One of a plurality of color filters 150 that transmit beams of incident light of different wavelengths is arranged in each pixel block unit 300 including four pixel blocks 200 arranged in two rows and two columns. The first resolution in the first imaging mode in which an image signal is generated for each pixel 100 is four times of the second resolution in the second imaging mode in which an image signal is generated for each pixel block 200. The second resolution is four times of the third resolution in the third imaging mode in which an image signal is generated for each pixel block unit 300. This produces an effect of generating image signals having different resolutions.

Furthermore, the first frame rate in the first imaging mode may be approximately ¼ of the second frame rate in the second imaging mode. The third frame rate in the third imaging mode may be approximately ¼ of the second frame rate. This enables application of a resolution in accordance with a frame rate.

A sensor includes the imaging element 10 in which a plurality of pixels 100 is arranged in a two-dimensional matrix. The plurality of pixels 100 performs photoelectric conversion on incident light from a subject, and generates an image signal. In the sensor, one of a plurality of color filters 150 that transmit beams of incident light of different wavelengths is arranged in each pixel block unit 300 in which pixel blocks 200 are arranged in two rows and two columns. The pixel blocks 200 include four pixels 100 arranged in two rows and two columns. The sensor operates in the first imaging mode, the second imaging mode, and the third imaging mode. In the first imaging mode, an image signal is generated for each pixel 100. In the second imaging mode, an image signal is generated for each pixel block 200. In the third imaging mode, an image signal is generated for each pixel block unit 300. This produces an effect of generating image signals having different resolutions.

An imaging control device outputs, to a sensor, a control signal for switching between the first mode, the second mode, and the third mode based on a second image signal generated in one of the first mode, the second mode, and the third mode by the sensor. The imaging control device outputs, to the sensor, a control signal for switching between the first mode, the second mode, and the third mode based on the second image signal generated in one of the first mode, the second mode, and the third mode by the sensor including the first mode, the second mode, and the third mode. In the first mode, an image signal is generated for each pixel 100 that performs photoelectric conversion on incident light from a subject. In the second mode, an image signal is generated for each pixel block 200 including four pixels arranged in two rows and two columns. In the third mode, an image signal is generated for each pixel block unit 300 including four pixel blocks 200 arranged in two rows and two columns. This produces an effect of generating image signals having different resolutions.

Note that the effects described in the present specification are merely examples and not limitations. Other effects may be obtained.

Note that the present technology can also have the configurations as follows.

(1)
An imaging device comprising:
an imaging element in which pixel blocks are arranged in a two-dimensional matrix, the pixel blocks including a plurality of pixels that performs photoelectric conversion on incident light from a subject and generates an image signal and an on-chip lens that is arranged in common in the plurality of pixels and that collects the incident light on the plurality of pixels;
a resolution selection unit that selects a first resolution in accordance with a size of the pixels, a second resolution in accordance with a size of the pixel blocks, and a third resolution in accordance with a size of a pixel block unit including a plurality of adjacent pixel blocks; and
an image signal addition unit that generates a second image signal by adding generated image signals in accordance with a selected resolution.

(2)
The imaging device according to the above (1),
wherein one of a plurality of color filters that transmit beams of incident light of different wavelengths is arranged in a pixel.

(3)
The imaging device according to the above (2),
wherein a color filter that transmits beams of incident light of a same wavelength on each pixel of a plurality of pixel blocks of the pixel block unit itself is arranged in the pixel block unit.

(4)
The imaging device according to the above (2),
wherein the plurality of color filters is arranged in an array of a predetermined arrangement order in the plurality of pixels.

(5)
The imaging device according to the above (4), further comprising a signal processing unit that performs remosaic processing in which the image signal is converted into an image signal in an array of an arrangement order of the plurality of color filters different from the array.

(6)
The imaging device according to the above (5),
wherein the signal processing unit performs the remosaic processing in accordance with the selected resolution.

(7)
The imaging device according to any one of the above (1) to (6), further comprising a target region detection unit that detects a target region, which is a region of an image including a target to be imaged among subjects in the image including the generated image signals,
wherein the resolution selection unit selects a resolution in accordance with the target region that has been detected.

(8)
The imaging device according to the above (7),
wherein the target region detection unit detects the target region based on an instruction of a user.

(9)
The imaging device according to the above (7),
wherein the target region detection unit detects the target region from the image that has been preliminarily generated.

(10)
The imaging device according to any one of the above (1) to (9), further comprising a sensor that measures a distance to a subject,
wherein the resolution selection unit selects the resolution in accordance with the distance that has been measured.

(11)
The imaging device according to any one of the above (1) to (10),
wherein the resolution selection unit selects the resolution in accordance with a frame rate of an image at a time of generating a moving image, which is generated by a plurality of images generated in time series.

(12)
The imaging device according to any one of the above (1) to (11),
wherein the pixel further generates a phase difference signal for detecting an image plane phase difference by performing pupil division on the subject, and
the image signal addition unit generates a second phase difference signal by adding phase difference signals that have been generated in accordance with the selected resolution.

(13)
The imaging device according to the above (12),
wherein the image signal addition unit adds the phase difference signals generated by two adjacent pixels in the pixel block when the second resolution is selected, and adds the phase difference signals generated by a plurality of pixels arranged in two adjacent pixel blocks when the third resolution is selected.

(14)
The imaging device according to any one of the above (1) to (13),
wherein the pixel block includes four pixels arranged in two rows and two columns.

(15)
An imaging device comprising:
a plurality of pixels that perform photoelectric conversion on incident light and generate an image signal, the plurality of pixels being arranged in a two-dimensional matrix; and
a plurality of on-chip lenses arranged in each pixel block including four pixels arranged in two rows and two columns,
wherein one of a plurality of color filters that transmit the beams of incident light of different wavelengths is arranged in each pixel block unit including four pixel blocks arranged in two rows and two columns,
a first resolution in a first imaging mode in which an image signal is generated for each pixel is four times of a second resolution in a second imaging mode in which an image signal is generated for each pixel block, and
the second resolution is four times of a third resolution in a third imaging mode in which an image signal is generated for each pixel block unit.

(16)
The imaging device according to the above (15),
wherein a first frame rate in the first imaging mode is approximately ¼ of a second frame rate in the second imaging mode, and
a third frame rate in the third imaging mode is approximately ¼ of the second frame rate.

(17)
A sensor comprising an imaging element that performs photoelectric conversion on incident light from a subject and generates an image signal, a plurality of pixels being arranged in a two-dimensional matrix in the imaging element,
  wherein one of a plurality of color filters that transmit beams of incident light of different wavelengths is arranged in each pixel block unit in which pixel blocks are arranged in two rows and two columns, the pixel blocks including four pixels arranged in two rows and two columns, and
  the sensor operates in one of a first imaging mode in which an image signal is generated for each pixel, a second imaging mode in which an image signal is generated for each pixel block, and a third imaging mode in which an image signal is generated for each pixel block unit.

(18)

An imaging control device that outputs, to a sensor, a control signal for switching between a first mode, a second mode, and a third mode based on a second image signal generated in one of the first mode, the second mode, and the third mode by the sensor including the first mode in which an image signal is generated for each pixel that performs photoelectric conversion on incident light from a subject, the second mode in which an image signal is generated for each pixel block including four pixels arranged in two rows and two columns, and the third mode in which an image signal is generated for each pixel block unit including four pixel blocks arranged in two rows and two columns.

REFERENCE SIGNS LIST

1 IMAGING DEVICE
10 IMAGING ELEMENT
20 IMAGE SIGNAL ADDITION UNIT
30 SIGNAL PROCESSING UNIT
33 REMOSAIC PROCESSING UNIT
34 LUMINANCE SIGNAL GENERATION UNIT
40 IMAGING CONTROL UNIT
50 TARGET REGION DETECTION UNIT
60 STORAGE UNIT
70 IMAGING LENS
80 DISTANCE MEASUREMENT UNIT
90 FOCAL POSITION DETECTION UNIT
100 PIXEL
150 COLOR FILTER
170 ON-CHIP LENS
200 PIXEL BLOCK
300 PIXEL BLOCK UNIT

The invention claimed is:

1. An imaging device comprising:
  an imaging element in which pixel blocks are arranged in a two-dimensional matrix, the pixel blocks including a plurality of pixels that performs photoelectric conversion on incident light from a subject and generates an image signal and an on-chip lens that is arranged in common in the plurality of pixels and that collects the incident light on the plurality of pixels;
  a resolution selection unit that selects a first resolution in accordance with a size of the pixels, a second resolution in accordance with a size of the pixel blocks, and a third resolution in accordance with a size of a pixel block unit including a plurality of adjacent pixel blocks; and
  an image signal addition unit that generates a second image signal by adding generated image signals in accordance with a selected resolution.

2. The imaging device according to claim 1,
  wherein one of a plurality of color filters that transmit beams of incident light of different wavelengths is arranged in a pixel.

3. The imaging device according to claim 2,
  wherein a color filter that transmits beams of incident light of a same wavelength on each pixel of a plurality of pixel blocks of the pixel block unit itself is arranged in the pixel block unit.

4. The imaging device according to claim 2,
  wherein the plurality of color filters is arranged in an array of a predetermined arrangement order in the plurality of pixels.

5. The imaging device according to claim 4, further comprising a signal processing unit that performs remosaic processing in which the image signal is converted into an image signal in an array of an arrangement order of the plurality of color filters different from the array.

6. The imaging device according to claim 5,
  wherein the signal processing unit performs the remosaic processing in accordance with the selected resolution.

7. The imaging device according to claim 1, further comprising a target region detection unit that detects a target region, which is a region of an image including a target to be imaged among subjects in the image including the generated image signals,
  wherein the resolution selection unit selects a resolution in accordance with the target region that has been detected.

8. The imaging device according to claim 7,
  wherein the target region detection unit detects the target region based on an instruction of a user.

9. The imaging device according to claim 7,
  wherein the target region detection unit detects the target region from the image that has been preliminarily generated.

10. The imaging device according to claim 1, further comprising a sensor that measures a distance to a subject,
  wherein the resolution selection unit selects the resolution in accordance with the distance that has been measured.

11. The imaging device according to claim 1,
  wherein the resolution selection unit selects the resolution in accordance with a frame rate of an image at a time of generating a moving image, which is generated by a plurality of images generated in time series.

12. The imaging device according to claim 1,
  wherein the pixel further generates a phase difference signal for detecting an image plane phase difference by performing pupil division on the subject, and
  the image signal addition unit generates a second phase difference signal by adding phase difference signals that have been generated in accordance with the selected resolution.

13. The imaging device according to claim 12,
  wherein the image signal addition unit adds the phase difference signals generated by two adjacent pixels in the pixel block when the second resolution is selected, and adds the phase difference signals generated by a plurality of pixels arranged in two adjacent pixel blocks when the third resolution is selected.

14. The imaging device according to claim 1,
  wherein the pixel block includes four pixels arranged in two rows and two columns.

15. An imaging device comprising:
  a plurality of pixels that perform photoelectric conversion on incident light and generate an image signal, the plurality of pixels being arranged in a two-dimensional matrix; and a plurality of on-chip lenses arranged in each pixel block including four pixels arranged in two rows and two columns, wherein one of a plurality of color filters that transmit the beams of incident light of different wavelengths is arranged in each pixel block unit including four pixel blocks arranged in two rows and two columns, a first resolution in a first imaging mode in which an image signal is generated for each pixel is four times of a second resolution in a second imaging mode in which an image signal is generated for each pixel block, and the second resolution is four times of a third resolution in a third imaging mode in which an image signal is generated for each pixel block unit.

16. The imaging device according to claim 15, wherein a first frame rate in the first imaging mode is approximately ¼ of a second frame rate in the second imaging mode, and a third frame rate in the third imaging mode is approximately ¼ of the second frame rate.

17. A sensor comprising an imaging element that performs photoelectric conversion on incident light from a subject and generates an image signal, a plurality of pixels being arranged in a two-dimensional matrix in the imaging element, wherein one of a plurality of color filters that transmit beams of incident light of different wavelengths is arranged in each pixel block unit in which pixel blocks are arranged in two rows and two columns, the pixel blocks including four pixels arranged in two rows and two columns, and the sensor operates in one of a first imaging mode in which an image signal is generated for each pixel, a second imaging mode in which an image signal is generated for each pixel block, and a third imaging mode in which an image signal is generated for each pixel block unit.

18. An imaging control device that outputs, to a sensor, a control signal for switching between a first mode, a second mode, and a third mode based on a second image signal generated in one of the first mode, the second mode, and the third mode by the sensor including the first mode in which an image signal is generated for each pixel that performs photoelectric conversion on incident light from a subject, the second mode in which an image signal is generated for each pixel block including four pixels arranged in two rows and two columns, and the third mode in which an image signal is generated for each pixel block unit including four pixel blocks arranged in two rows and two columns.

* * * * *